(12) United States Patent
Kato et al.

(10) Patent No.: US 7,768,272 B2
(45) Date of Patent: Aug. 3, 2010

(54) CAPACITANCE DETECTING APPARATUS INCLUDING FIRST AND SECOND VARIABLE CAPACITORS WHICH VARY WITH THE DISTANCE TO AN OBJECT

(75) Inventors: Manabu Kato, Nagoya (JP); Eiji Fujioka, Kariya (JP)

(73) Assignee: Aisin Seiki Kabushiki Kaisha, Kariya-Shi, Aichi-Ken (JP)

( * ) Notice: Subject to any disclaimer, the term of this patent is extended or adjusted under 35 U.S.C. 154(b) by 347 days.

(21) Appl. No.: 11/851,947

(22) Filed: Sep. 7, 2007

(65) Prior Publication Data
US 2008/0252303 A1 Oct. 16, 2008

(30) Foreign Application Priority Data
Sep. 8, 2006 (JP) ............... 2006-243632
Feb. 13, 2007 (JP) ............... 2007-032075

(51) Int. Cl.
*G01R 27/26* (2006.01)
(52) U.S. Cl. ........................ 324/672; 324/663
(58) Field of Classification Search ................ 324/672, 324/663
See application file for complete search history.

(56) References Cited

U.S. PATENT DOCUMENTS

| 6,466,036 | B1 | 10/2002 | Philipp |
| 6,828,806 | B1 | 12/2004 | Hirota et al. |
| 7,015,705 | B2 | 3/2006 | Inaba et al. |
| 7,116,117 | B2* | 10/2006 | Nakano et al. ............ 324/688 |
| 7,456,731 | B2* | 11/2008 | Umemura et al. ......... 340/436 |
| 7,498,822 | B2* | 3/2009 | Lee .......................... 324/662 |
| 2007/0126432 | A1* | 6/2007 | Goto ......................... 324/658 |

FOREIGN PATENT DOCUMENTS

| JP | 2001-094408 (A) | 4/2001 |
| JP | 2002-221402 A | 8/2002 |
| JP | 2002-221402 (A) | 8/2002 |
| JP | 2005-106665 (A) | 4/2005 |

OTHER PUBLICATIONS

U.S. Appl. No. 11/987,208, filed Nov. 28, 2007, Manabu Kato.

* cited by examiner

*Primary Examiner*—Jeff Natalini
(74) *Attorney, Agent, or Firm*—Buchanan Ingersoll & Rooney PC

(57) ABSTRACT

A capacitance detecting apparatus includes: a first on/off switch; a first reference capacitor; a second on/off switch; a third on/off switch; a first sensor electrode; a fourth on/off switch; a second reference capacitance; a fifth on/off switch; a sixth on/off switch; a second sensor electrode; a comparator; switch controlling means for alternately repeating a second switch operation and a third switch operation following a first switch operation; counting means for counting a number of times for repeating the second switch operation; and judging means for judging changes in capacitances related to the first and second sensor electrodes, based upon the number of times for repeating the second switch operation counted by the counting means before a level of voltage at the first input terminal and a level of voltage at the second input terminal are reversed.

4 Claims, 14 Drawing Sheets

Center of Mass

F I G. 14
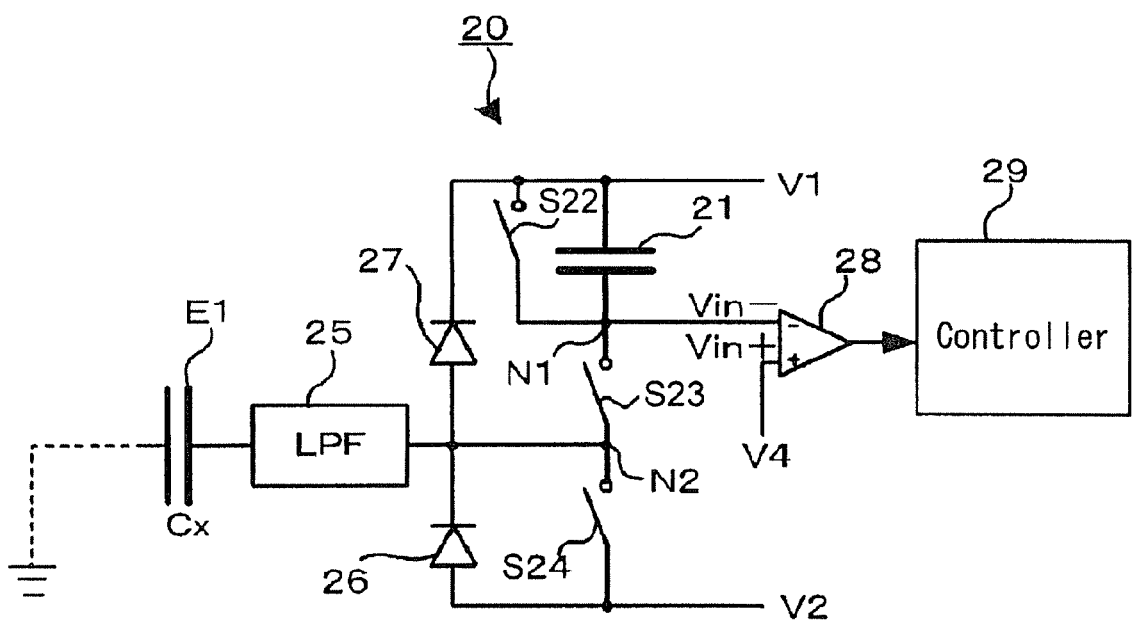

CAPACITANCE DETECTING APPARATUS INCLUDING FIRST AND SECOND VARIABLE CAPACITORS WHICH VARY WITH THE DISTANCE TO AN OBJECT

CROSS REFERENCE TO RELATED APPLICATIONS

This application is based on and claims priority under 35 U.S.C. §119 to Japanese Patent Application 2006-243632, filed on Sep. 8, 2006, and 2007-32075, filed on Feb. 13, 2007, the entire content of which is incorporated herein by reference.

FIELD OF THE INVENTION

The present invention relates to a capacitance detecting apparatus.

BACKGROUND

U.S. Pat. No. 6,466,036 (reference 1) and JP2005-106665A (reference 2) disclose conventional capacitance detecting apparatus.

The capacitance detecting apparatus is incorporated in a system for controlling an opening/closing operation of a door for a vehicle such as an automobile. A detection signal of the capacitance detecting apparatus is employed as a trigger signal for unlocking the vehicle door. Specifically, a control system is set at a door-unlock allowing mode when an ID code is matched between an in-vehicle controller and an operator approaching the vehicle. In this case, when the operator touches an unlock sensor (electrode) housed inside an outside door handle of the vehicle door, the capacitance detecting apparatus detects changes in the capacitance at the electrode and outputs a trigger signal for unlocking the vehicle door. In other words, the capacitance detecting apparatus detects an intention of the operator for unlocking based upon the changes in the capacitance, so that the trigger signal for unlocking is outputted.

A capacitance detecting apparatus is incorporated in a safety device for controlling a distance between a head of an occupant and a headrest of a seat, thereby evading whiplash injury that may be occur upon a vehicle rear impact. The capacitance detecting apparatus can be employed as a distance sensor for detecting a distance between the head of the occupant and the headrest based upon changes in capacitance in response to a distance between an electrode embedded in the headrest and the head of the occupant.

As illustrated in FIG. 18, the capacitance detecting apparatus disclosed in Reference 1, one end of a reference capacitor Cs is connected to a DC power-supply via an oil/off switch S1. The reference capacitor Cs is connected, at the other end, to a variable capacitor Cx and a on/off switch S2. One end of the variable capacitor Cx is grounded, or connected to a free space, via a sensor electrode. Both ends of the reference capacitor Cs are connected to the on/off switch S3. The reference capacitor Cs is connected, at the one end, to a comparator CMP and a control circuit. The comparator CMP selves as a voltage measuring unit for measuring a voltage at the one end of the reference capacitor Cs.

As illustrated in FIG. 19, first of all, the on/off switches S2 and S3 are closed so that the reference capacitor Cs and the variable capacitor Cx are electrically discharged. Next, the on/off switch S1 is closed so that the reference capacitor Cs and the variable capacitor Cx are electrically charged by the DC power-supply. The voltage at the reference capacitor Cs hence increases up to a level of voltage defined by a ratio between a capacitance of the reference capacitor Cs and a capacitance of the variable capacitor Cx. The on/off switch S1 is then opened and the on/off switch S2 is then closed, whereby the other end of the reference capacitor Cs is grounded. The variable capacitor Cx is electrically discharged, and the voltage measuring unit repeatedly measures the voltage of the reference capacitor Cs. The control circuit counts a number of times before the voltage of the reference capacitor Cs reaches a predetermined voltage level. A presence, or an absence, of changes in the variable capacitance Cx is detected based upon increment/decrement of the number of times.

Reference 1 further discloses a capacitance detecting apparatus for detecting a presence, or an absence, of changes in two variable capacitances. In this capacitance detecting apparatus, a reference capacitor Cs is connected to a first sensor electrode at one end and to a second sensor electrode at the other end. The first sensor electrode is connected to a variable capacitor Cx1 of which one end is grounded or connected to a free space. The second sensor electrode is connected to a variable capacitor Cx2 of which one end is grounded or connected to a free space. The one end of the reference capacitor Cs is connected to a DC power-supply via an on/off switch S1 and is grounded via an on/off switch S2. The other end of the reference capacitor Cs is connected to a DC power-supply via an on/off switch S3 and is grounded via an on/off switch S4. In this capacitance detecting apparatus, the on/off switches S1 to S4 are operated and voltages at both ends of the reference capacitor Cs are measured by two voltage measuring units, respectively. As a result, a presence, or an absence, of changes in capacitance at each variable capacitor Cx1, Cx2 is detected.

In the capacitance detecting apparatus disclosed in Reference 2, one end of a reference capacitor Cs, which is connected to an on/off switch S1, is connected to a DC power-supply, the other end of the reference capacitor Cs is connected to one end of a variable capacitor Cx, and the other end of the variable capacitor Cx is grounded. An on/off switch S3 is connected to the one end, and the other end, of the variable capacitor Cx. The capacitance detecting apparatus alternately repeats a second switch operation, by which the on/off switch S2 is switched to a closed state and returned to an open state, and a third switch operation, by which the on/off switch S3 is switched to a closed state and returned to an open state, following a first switch operation, by which the on/off switch S1 is switched to a closed state. The capacitance detecting apparatus detects changes in a value of capacitance of the variable capacitor Cx based upon a number of times of the second switch operation before the voltage of the other end of the reference capacitor Cs reaches a predetermined voltage level.

In each capacitance detecting apparatus disclosed in Reference 1, 2, a voltage of the sensor electrode changes widely so that large radio noise hence generates. Further, a possible disturbance (noise), which is induced in sync with an operation of the on/off switch S2 or S4, may occasionally influence on an operation for detecting capacitance of the variable capacitor Cx.

A need thus exists for a capacitance detecting apparatus, which is not susceptible to the drawback mentioned above.

SUMMARY OF THE INVENTION

According to an aspect of the present invention, a capacitance detecting apparatus includes: a first on/off switch connected to a first power-supply voltage at one end and to a first electrical node at the other end; a first reference capacitor connected to the first electrical node at one end and to a third power-supply voltage; a second on/off switch connected to the first electrical node at one end and to a second electrical node at the other end; a third on/off switch connected to the second electrical node at one end and to a second power-supply voltage at the other end; a first sensor electrode connected to the second electrical node and facing a measured object, a first capacitance being formed between the first sensor electrode and the measured object in response to a distance between the first sensor electrode and the measured object; a fourth on/off switch connected to the second power-supply voltage at one end and to a third electrical node at the other end; a second reference capacitance connected to the third electrical node at one end and to a fourth power-supply voltage at the other end; a fifth on/off switch connected to the third electrical node at one end and to a fourth electrical node at the other end; a sixth on/off switch connected to the fourth electrical node at one end and to the first power-supply voltage at the other end; a second sensor electrode connected to the fourth electrical node and facing the measured object, a second capacitance being formed between the second sensor electrode and the measured object, the second sensor electrode being arranged adjacent to the first sensor electrode so as to define a fixed capacitance between the second sensor electrode and the first sensor electrode; a comparator having a first input terminal connected to the first electrical node and a second input terminal connected to the third electrical node; switch controlling means for alternately repeating a second switch operation, by which each of the second and fifth on/off switches, is changed to a closed state and returned to an open state, and a third switch operation, by which each of the third and sixth on/off switches, is changed to a closed state and returned to an open state, following a first switch operation, by which each of the first and fourth oil/off switches, is changed to a closed state and returned to an open state; counting means for counting a number of times for repeating the second switch operation; and judging means for judging changes in the first capacitance defined between the first sensor electrode and the measured object and changes in the second capacitance defined between the second sensor electrode and the measured object based upon the number of times for repeating the second switch operation counted by the counting means before a level of voltage at the first input terminal and a level of voltage at the second input terminal of the comparator are reversed.

BRIEF DESCRIPTION OF THE DRAWINGS

The foregoing and additional features and characteristics of the present invention will become more apparent from the following detailed description considered with reference to the accompanying drawings, wherein:

FIG. 14 is a circuit view illustrating a capacitance detecting apparatus according to a fourth embodiment of the present invention;

DETAILED DESCRIPTION

Embodiments will be described below with reference to the attached drawings.

First Embodiment

Figure 1:
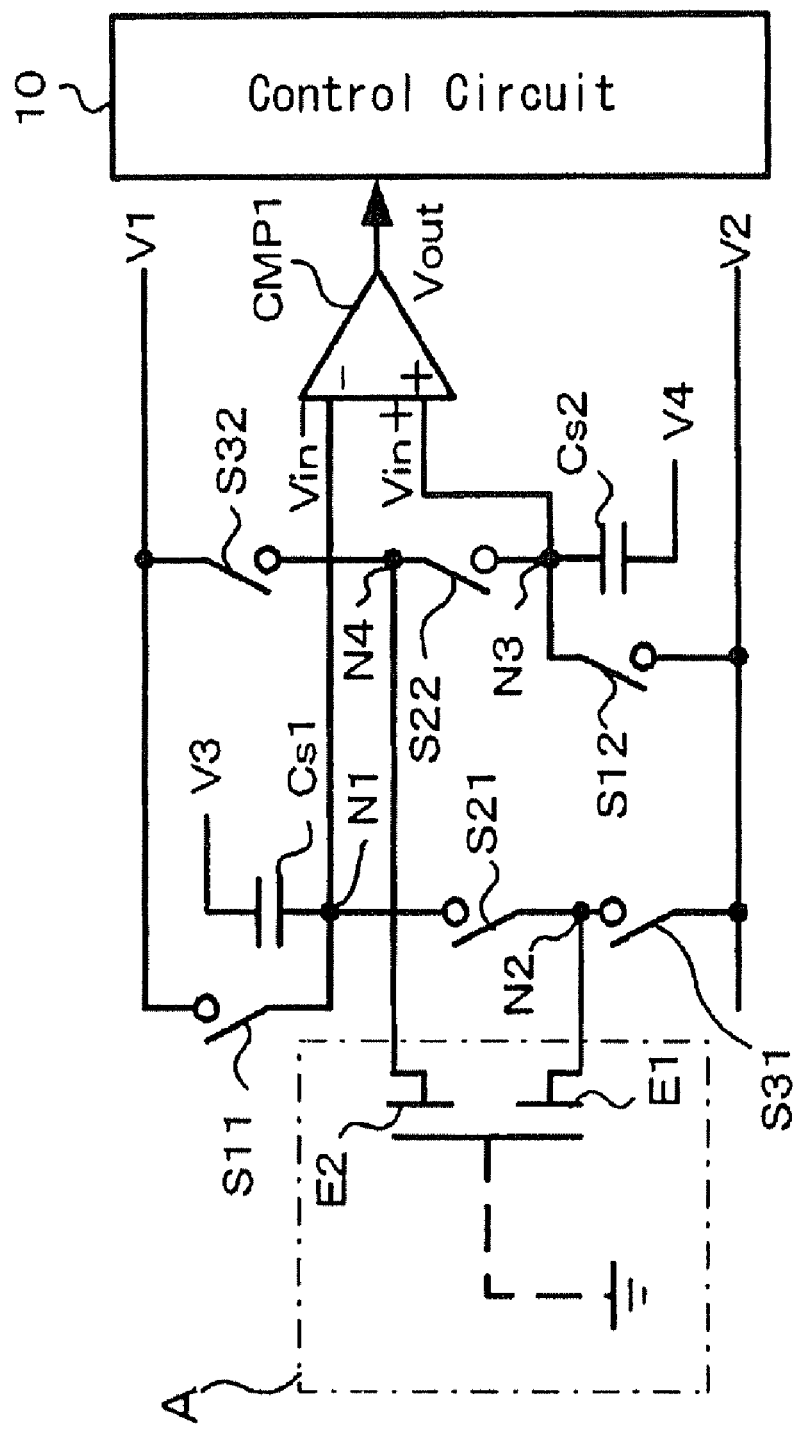
FIG. 1 is a circuit view illustrating a capacitance detecting apparatus according to a first embodiment of the present invention.
Figure 2:
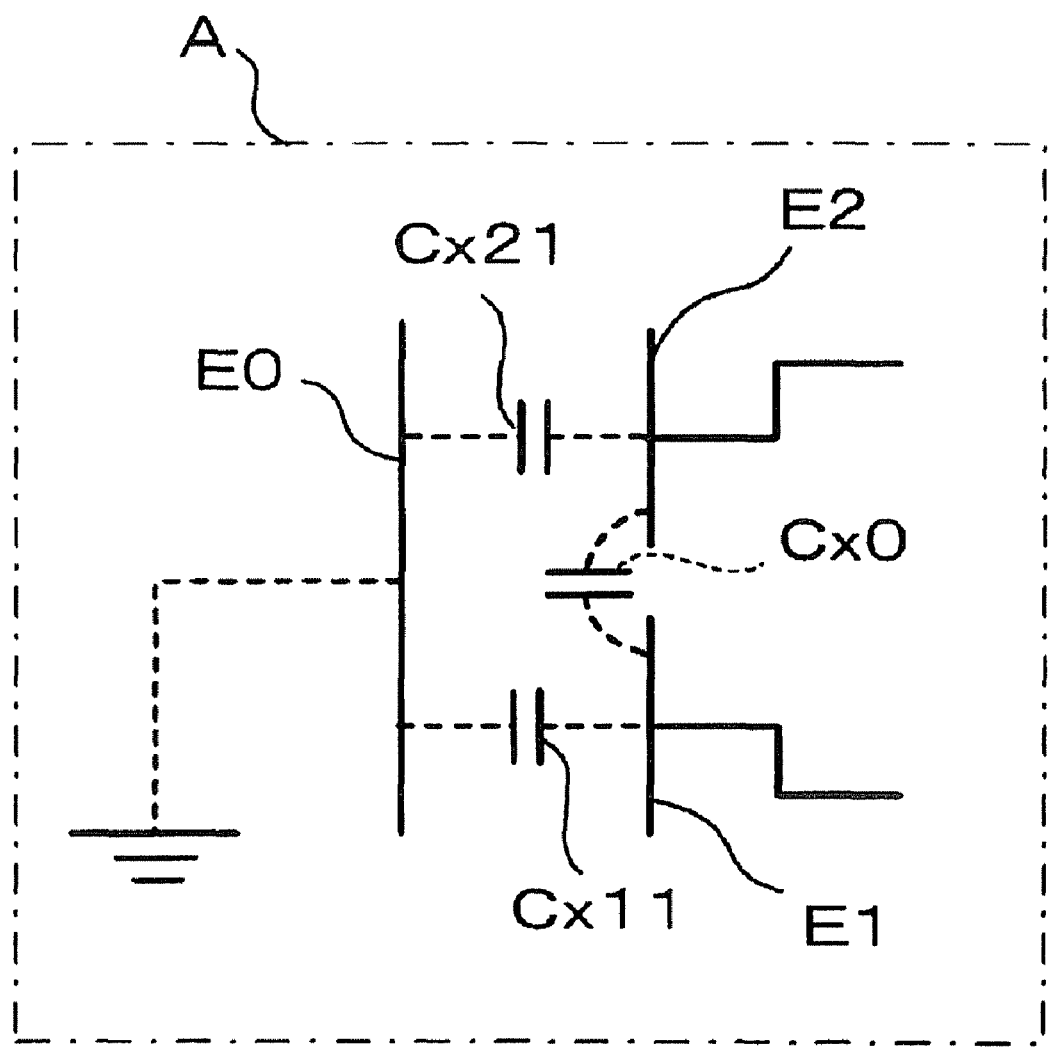
FIG. 2 is an explanatory view of a portion depicted at A in FIG. 1.

FIG. 1 is a circuit view illustrating a capacitance detecting apparatus according to a first embodiment of the present invention, and FIG. 2 is an explanatory view of a portion depicted at A in FIG. 1.

The capacitance detecting apparatus includes: a first on/off switch S11; a second on/off switch S21; a third on/off switch S31; a fourth on/off switch S12; a fifth on/off switch S22; a sixth on/off switch S32; a first reference capacitor Cs1; a second reference capacitor Cs2; a first sensor electrode E1; a second sensor electrode E2; a comparator CMP1; a switch controller (not illustrated); and a control circuit 10 implementing counting means for counting a number of times of switch operations.

The first on/off switch S11 is connected to a first power-supply voltage V1 (first power-supply voltage) at one end and to a first electrical node N1 at the other end. The first electrical node N1 is connected to one end of the first reference capacitor Cs1, one end of the second on/off switch S21 and a first input terminal Vin− of the comparator CMP1.

The second on/off switch S21 is connected to a second electrical node N2 at the other end. The second electrical node N2 is connected to the first sensor electrode E1 and one end of the third on/off switch S31. The third on/off switch S31 is connected, at the other end, to a second power-supply voltage V2 (second power-supply voltage). The first reference capacitor Cs1 is connected to a third power-supply voltage V3 (third power-supply voltage) at the other end. The third power-supply voltage V3 may be substantially equal to the first power-supply voltage V1.

The fourth on/off switch S12 is connected to the second power-supply voltage V2 at one end and to the third electrical node N3 at the other end. The third electrical node N3 is connected to one end of the second reference capacitor Cs2, one end of the fifth on/off switch S22 and a second input terminal Vin+ of the comparator CMP1.

The fifth on/off switch S22 is connected to the fourth electrical node N4 at the other end. The fourth electrical node N4 is connected to the second sensor electrode E2 and one end of the sixth on/off switch S32. The sixth on/off switch S32 is connected to the first power-supply voltage V1 at the other end. The second reference capacitor Cs2 is connected to the fourth power-supply voltage V4 (fourth power-supply voltage) at the other end. The fourth power-supply voltage V4 may be substantially equal to the second power-supply voltage V2.

An output terminal of the comparator CMP1 is connected to the control circuit 10. A switch controller (switch controlling means), which is not illustrated, controls opening and closing operations of each on/off switch S11, S21, S31, S12, S22 and S32.

As illustrated in FIG. 2, a reference sign Cx11 hereinbelow depicts a first variable capacitance or a first variable capacitor. The first variable capacitor Cx11 includes a ground electrode E0 and the first sensor electrode E1 arranged to face the ground electrode E0. Hence, the sensor electrode E1 serves as an electrode at one end of the first variable capacitor Cx11, and the ground electrode E0 is a grounded medium (measured object), such as a hand or head of an operator such as an occupant. The variable capacitance Cx11 varies in response to a distance between the sensor electrode E1 and the ground electrode E0. Likewise, a reference sign Cx21 hereinbelow depicts a second variable capacitance or a second variable capacitor. A second variable capacitor Cx21 includes the ground electrode E0 and the second sensor electrode E2 arranged to face the ground electrode E0. Hence, the second sensor electrode E2 serves as an electrode at one side of the second variable capacitor Cx21, and the around electrode E0 is a grounded medium (measured object), such as a hand or head of an operator such as an occupant. The second variable capacitance Cx21 varies in response to a distance between the second sensor electrode E2 and the ground electrode E0. The first and second sensor electrodes E1 and E2 are arranged adjacent to each other, and a capacitance or a capacitor Cx0 is formed between the first sensor electrode E1 and the second sensor electrode E2.

Operation of the capacitance detecting apparatus in FIG. 1 is described below with reference to FIGS. 3A to 3G. FIGS. 3A to 3G are each a timing chart for explaining an operation of the capacitance detecting apparatus in FIG. 1. The first power-supply voltage V1 is higher than the second power-supply voltage V2. Initially, the capacitors Cs1, Cs2, Cx11, Cx21 and Cx0 are electrically discharged.

Figure 3:
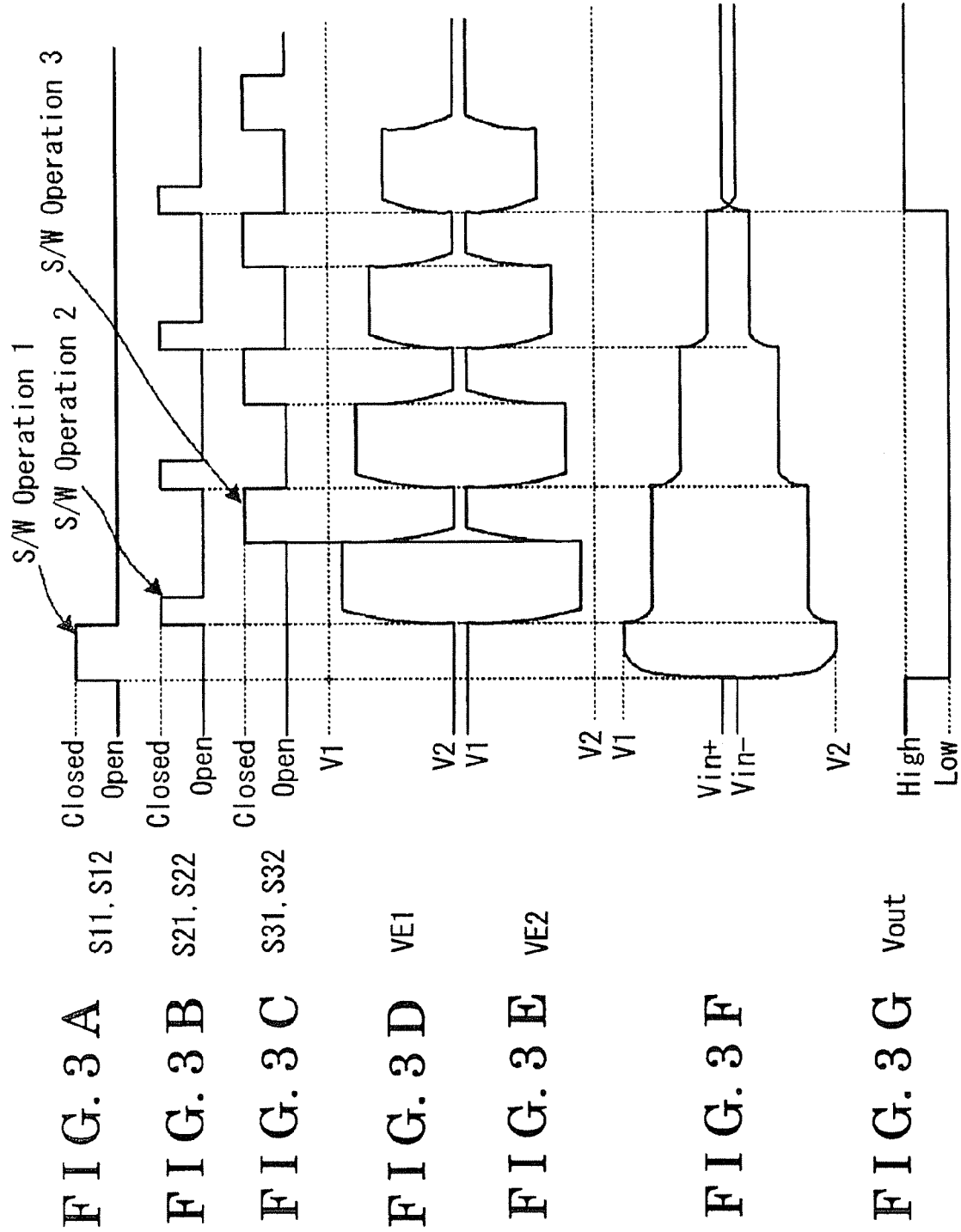
FIGS. 3A to 3G are timing charts for explaining an operation of the capacitance detecting apparatus.

As illustrated in FIGS. 3A, 3B and 3C, the switch controller implements a first switch operation (s/w operation 1, see FIG. 3A), a second switch operation (s/w operation 2, see FIG. 3B) and a third switch operation (s/w operation 3, see FIG. 3C). Through the first switch operation, the on/off switches S11 and S12 are each shifted from an open state to a closed state and maintained in a closed state for a predetermined period of time and, thereafter, are each returned to an open state. Through the second switch operation, the on/off switches S21 and S22 are each shifted from an open state to a closed state and maintained in a closed state for a predetermined period of time and, thereafter, are each returned to an open state. Through the third switch operation, the on/off switches S31 and S32 are each shifted from an open state to a closed state and maintained in a closed state for a predetermined period of time and, thereafter, are each returned to an open state. The second and third switch operations are alternately repeated following the first switch operation (switch controlling means).

The first switch operation may introduce the followings: the reference capacitors Cs1 and Cs2 are electrically charged; a voltage of the first input terminal Vin− of the comparator CMP1 is, for example, raised and a voltage of the second input terminal Vin+ of the comparator CMP1 is, for example, lowered. Such changes in the voltages are illustrated in FIG. 3F As a result, the comparator CMP1 outputs, from its output terminal, an output signal Vout at a low level, as illustrated in FIG. 3G.

The second switch operation is implemented in a manner that the first reference capacitor Cs1 is connected to the first variable capacitor Cx11 and the second reference capacitor Cs2 is connected to the second variable capacitor Cx21. The first and second reference capacitors Cs1 and Cs2 are electrically discharged and, then, the first and second variable capacitors Cx11 and Cx21 are electrically charged. As a result, a voltage VE1 of the first sensor electrode E1 is raised, and a voltage VE2 of the second sensor electrode E2 is lowered, as illustrated in FIGS. 3D and 3E. That is, the voltage VE1 of the first sensor electrode E1 changes in an opposite direction to the voltage VE2 of the second sensor electrode E2.

Here, the capacitance Cx0 is formed between the first sensor electrode E1 and the second sensor electrode E2. The change in the voltage VE1 of the first sensor electrode E1 hence occurs substantially at the same timing as the change in the voltage VE2 of the second sensor electrode E2, thereby restraining an occurrence of radio noise, which is induced due to a difference of the timing at which the voltages are changed.

Electric discharge at the first reference capacitor Cs1 decreases a level of voltage of the first input terminal Vin− of the comparator CMP1. Electric discharge at the second reference capacitor Cs2 increases a level of voltage of the second input terminal Vin+ of the comparator CMP1.

Repetition of the second and third switch operations lowers a level of voltage of the first input terminal Vin− of the comparator CMP1 and raises a level of voltage of the second input terminal Vin+ of the comparator CMP1. As a result, a level of voltage of the second input terminal Vin+, which has been lower than a level of voltage of the first input terminal Vin−, exceeds a level of voltage of the first input terminal Vin−. Therefore, the output signal Vout of the comparator CMP1 is shifted from a low level to a high level.

The control circuit 10 counts (counting means) a number of times of the second switch operation repeatedly implemented before the output signal Vout of the comparator CMP1 is shifted from the low level to the high level. The control circuit 10 judges (judging means) changes in the capacitances Cx11 and Cx21 based upon the number of times for repeating the second switch operation.

The capacitance detecting apparatus according to the first embodiment produces the following effects.

(1) The first, second and third switch operations are implemented in a state where the first and second sensor electrodes E1 and E2 are arranged adjacent to each other. In such circumstances, the voltage VE1 of the first sensor electrode E1 is changed substantially at the same timing as the voltage VE2 of the second sensor electrode E2. Further, the changing directions of the voltages VE1 and VE2 are opposite. Therefore, it is possible to reduce generations of radio noise.

(2) When the on/off switches S21 and S22 are in closed states, the changing directions of the voltages VE1 and VE2 are mutually opposite. As a result, changing directions of voltages of the input terminals Vin− and Vin+ are mutually opposite. Meanwhile, a presence of electromagnetic disturbances has some influence on changing the voltages of the input terminals Vin− and Vin+ in the same direction. Therefore, because the voltages VE1 and VE2 change in opposite directions, the voltages of the input terminals Vin− and Vin+ change in opposite directions. As a result, it is possible to restrain a possible influence of such electromagnetic disturbances applied onto the output signal Vout of the comparator CMP1.

(3) Meanwhile, an amount of charges induced by electromagnetic disturbances increases in proportion to an area of each sensor electrode E1 and E2. An electric potential change at the first reference capacitor Cs1, i.e., an electric potential change at the first input terminal Vin−, is in inverse proportion to the capacity for storing charges at the first reference capacitor Cs1 and is in proportion to an amount of stored charges. Likewise, an electric potential change at the second reference capacitor Cs2, i.e., an electric potential change at the second input terminal Vin+, is in inverse proportion to the capacity for storing charges at the second reference capacitor Cs2 and is in proportion to an amount of stored charges. Therefore, when the first ratio between the area of the first sensor electrode E1 and the storage capacity of the first reference capacitor Cs1 is equal to the second ratio between the area of the second sensor electrode E2 and the storage capacity of the second reference capacitor Cs1, increment/decrement of the voltages at the input terminals Vin− and Vin+ is equal to each other. As a result, it is possible to restrain a possible influence of electromagnetic disturbances onto the timing at which levels of voltages of the input terminals Vin− and Vin+ are reversed. The first and second ratios are considered to be equal when two significant figures of the first ratio are identical to two significant figures of the second ratio.

(4) When the areas of the first and second electrodes E1 and E2 are equal to each other, is possible to furthermore restrain generations of radio noise. When the first ratio between the area of the first sensor electrode E1 and the storage capacity of the first reference capacitor Cs1 is equal to the second ratio between the area of the second sensor electrode E2 and the storage capacity of the second reference capacitor Cs2, increment/decrement of the voltages VE1, VE2 at the first and second electrodes E1 and E2 is equal to each other, and generations of radio noise are still furthermore restrained. The first and second electrodes E1 are considered to each have an identical area when two significant figures of the first identical to two significant figures of the second area.

Second Embodiment

Figure 4:
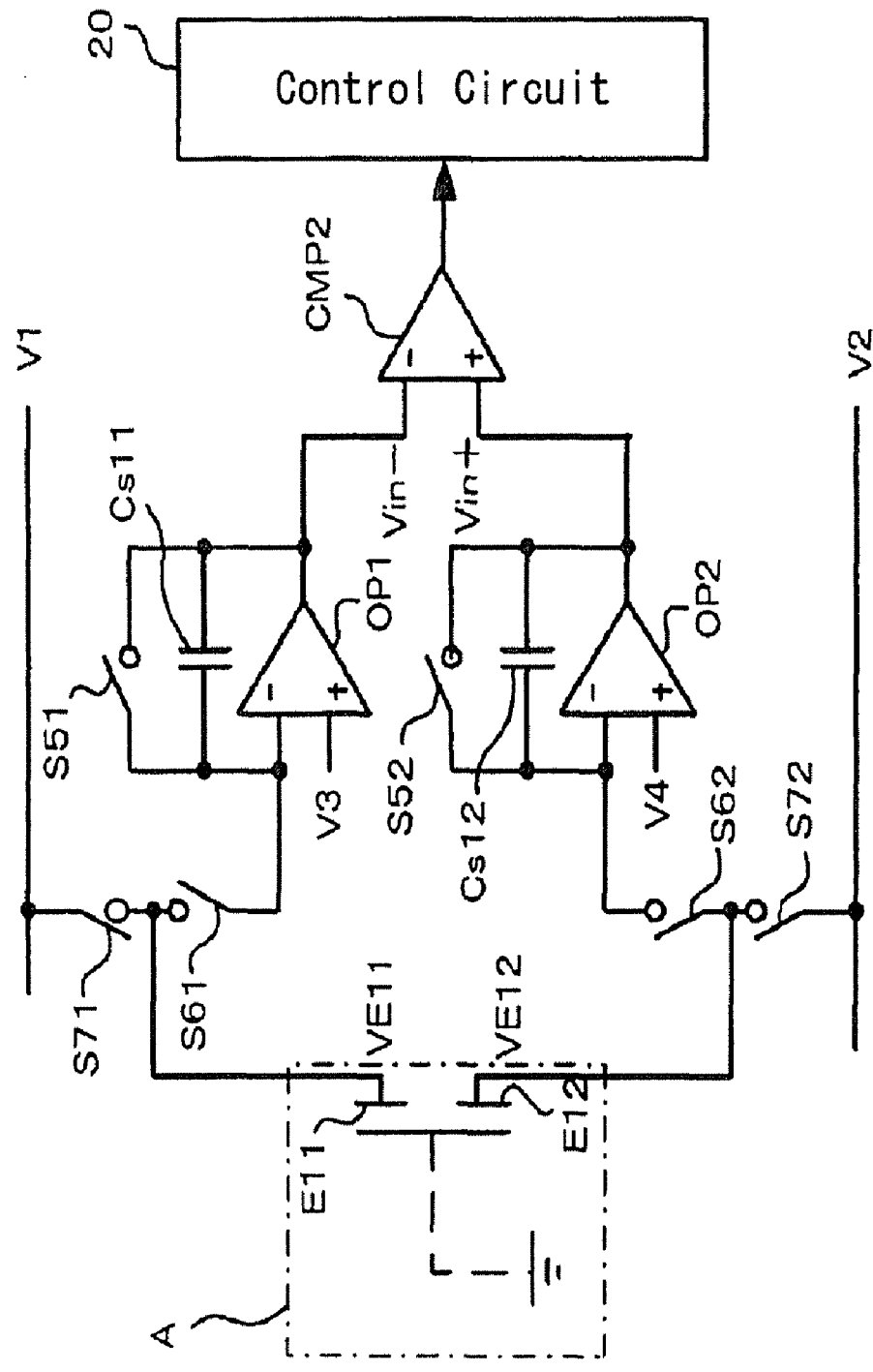
FIG. 4 is a circuit view illustrating a capacitance detecting apparatus according to a second embodiment of the present invention.
Figure 5:
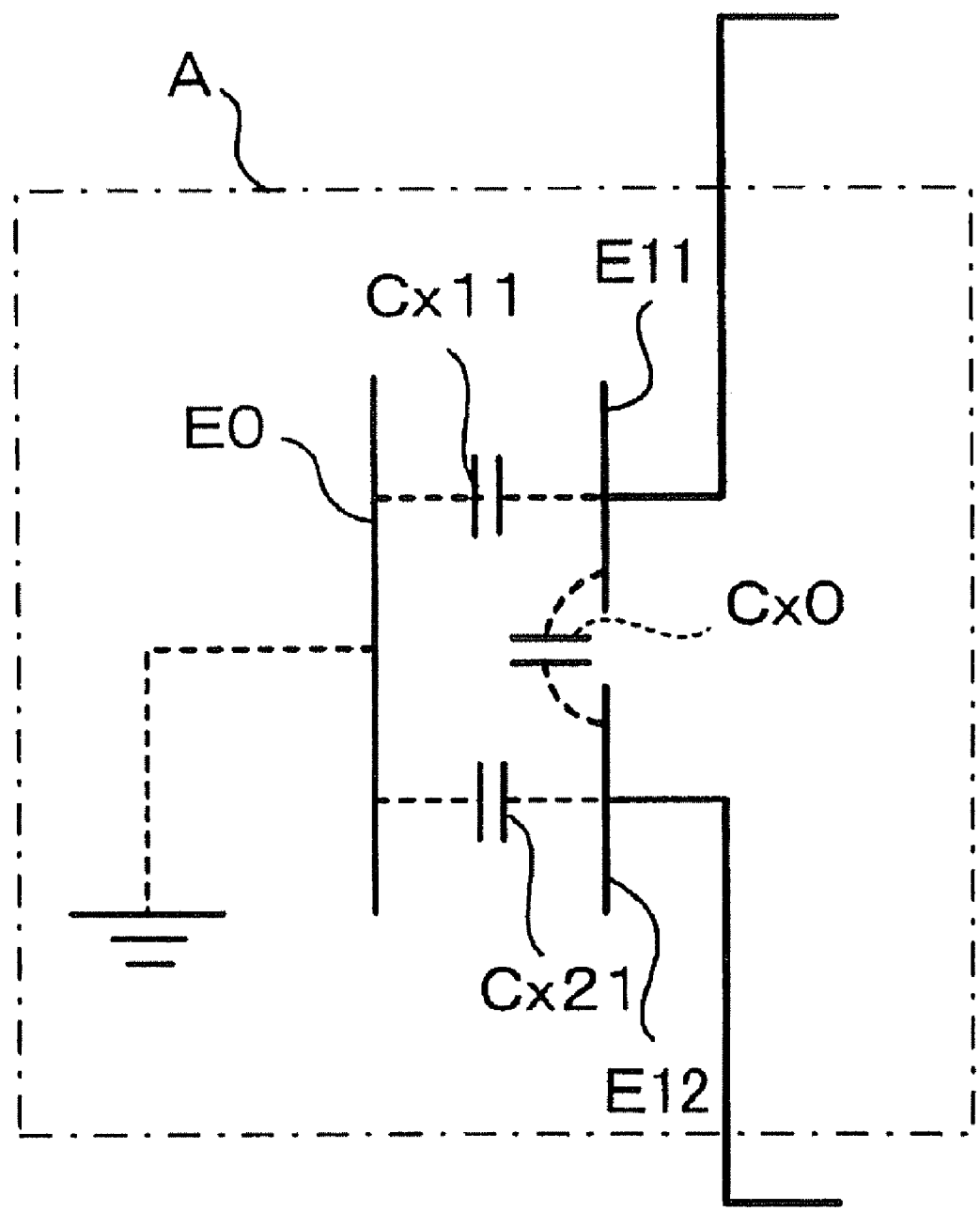
FIG. 5 is an explanatory view of a portion depicted at A in FIG. 4.

FIG. 4 is a circuit view illustrating a capacitance detecting apparatus according to a second embodiment of the present invention, and FIG. 5 is an explanatory view of a potion depicted at A in FIG. 4.

The capacitance detecting apparatus includes: on/off switches S51, S61, S71, S52, S62 and S72; first and second sensor electrodes Eli, E12; first and second reference capacitors Cs11, Cs12; first and second operation amplifiers (hereinafter referred to as an Op-Amp) OP1, OP2; a comparator CMP2; a control circuit 20; and a switch controller (not illustrated) controlling opening and closing operations of each on/off switch S51, S61, S71, S52, S62 and S72.

The Op-Amp OP1 is connected, at its output terminal, to one end of the reference capacitor Cs11 and one end of the on/off switch S51. The Op-Amp OP1 is further connected, and its inverting input terminal, to the other end of the reference capacitor Cs11, the other end of the on/off switch S51 and one end of the on/off switch S61. The on/off switch S61 is connected, at the other end, to one end of the on/off switch S71, of which the other end is connected to the first power-supply voltage V1, and to the first sensor electrode E11. The Op-Amp OP1 is still further connected, at its non-inverting input terminal, to the third power-supply voltage V3. The output terminal of Op-Amp OP1 is connected to the first input terminal Vin− of the comparator CMP2.

The Op-Amp Op2 is connected, at its output terminal, to one end of the reference capacitor Cs12 and one end of the on/off switch S52. The Op-Amp Op2 is further connected, at its inverting input terminal, to the other end of the reference capacitor Cs12, the other end of the on/off switch 52 and one end of the on/off switch S62. The on/off switch 62 is connected, at the other end, to one end of the on/off switch S72, of which the other end is connected to the second power-supply voltage V2, and the second sensor electrode E12. The Op-Amp Op2 is further connected, at its non-inverting input terminal, to the fourth power-supply voltage V4. The output terminal of the Op-Amp Op2 is connected to the second input terminal Vin+ of the comparator CMP2. The output terminal of the comparator CMP2 is connected to the control circuit 20.

As illustrated in FIG. 5, a reference sign Cx11 hereinbelow depicts a first variable capacitance or a first variable capacitor. The first variable capacitor Cx11 includes a ground electrode E0 and the first sensor electrode E11 arranged to face the ground electrode E0. Hence, the sensor electrode E11 serves as an electrode at one side of the first variable capacitor Cx11, and the ground electrode E0 is a grounded medium (measured object), such as a hand or head of an operator such as an occupant. The first variable capacitance Cx11 varies in response to a distance between the sensor electrode E11 and the ground electrode E0. Likewise, a reference sign Cx21 hereinbelow depicts a second variable capacitance or a second variable capacitor. A second variable capacitor Cx21 includes the ground electrode E0 and the second sensor electrode E12 arranged to face the ground electrode E0. Hence, the second sensor electrode E12 serves as an electrode at one side of the second variable capacitor Cx21, and the ground electrode E0 is a grounded medium (measured object), such as a hand or head of an operator such as an occupant. The second variable capacitance Cx21 is a measured object that varies in response to a distance between the second sensor electrode E12 and the ground electrode E0. The first and second sensor electrodes E11 and E12 are arranged adjacent to each other, and a capacitance or a capacitor Cx0 is formed between the first sensor electrode E11 and the second sensor electrode E12. As described above, the capacitance Cx0 is formed between the first sensor electrode E11 and the second sensor electrode E12. The change in the voltage VE11 of the first sensor electrode E11 hence occurs substantially at the same timing as the change in the voltage VE12 of the second sensor electrode E12.

For example, the first power-supply voltage V1 is higher than the third power-supply voltage V3, the third power-supply voltage V3 is higher than the fourth power-supply voltage V4, and the fourth power-supply voltage V4 is higher than the second power-supply voltage V2.

Operation of the capacitance detecting apparatus in FIG. 4 is described below with reference to FIGS. 6A to 6G. FIGS. 6A to 6G are each a timing chart for explaining an operation of the capacitance detecting apparatus in FIG. 4. Initially, the voltage VE11 of the first sensor electrode E11 is electrically charged at the first power-supply voltage V1, and the voltage VE12 of the second sensor electrode E12 is electrically charged at the second power-supply voltage V2.

Figure 6:
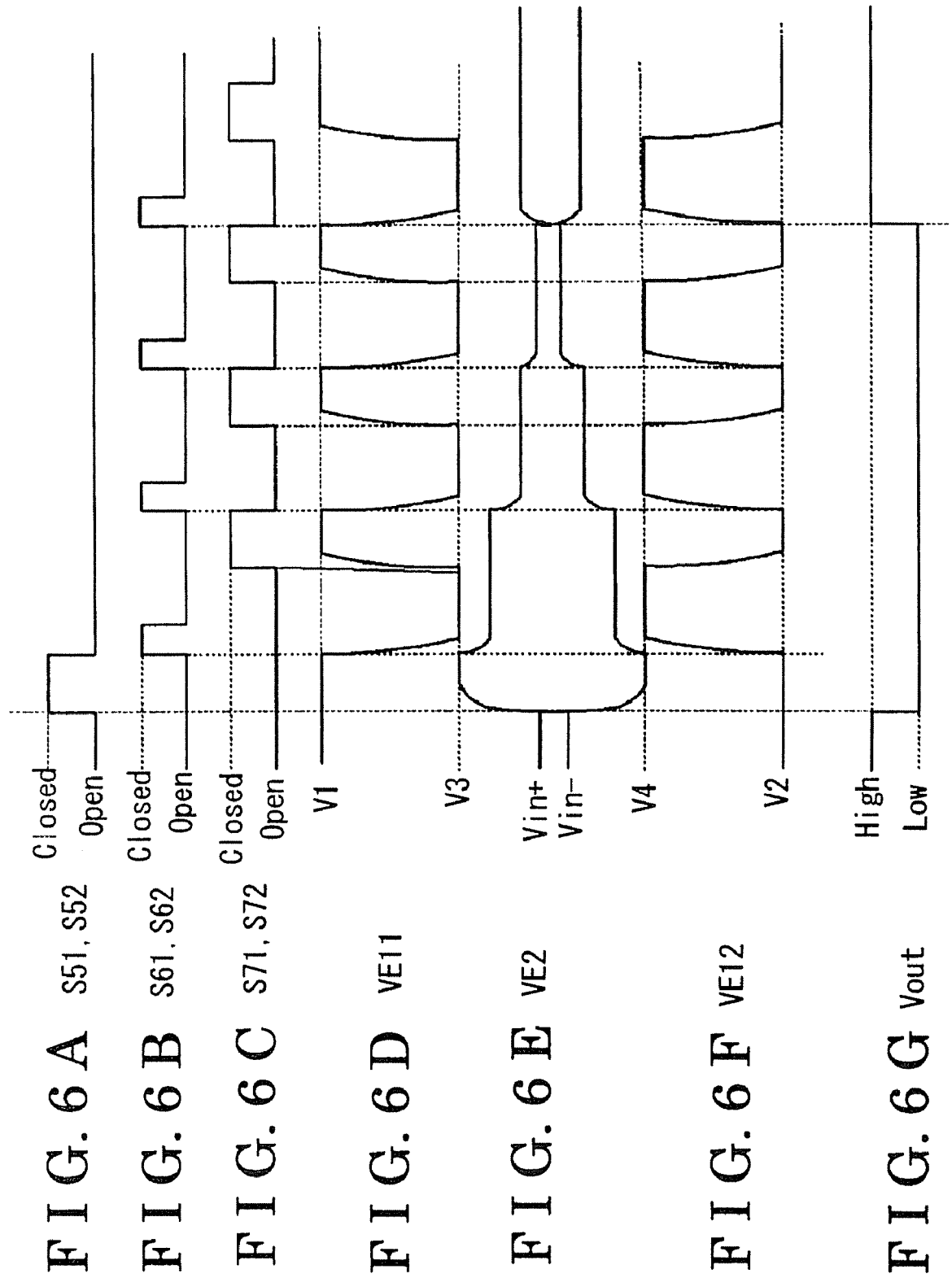
FIGS. 6A to 6G are timing charts for explaining an operation of the capacitance detecting apparatus.

As illustrated in FIGS. 6A, 6B and 6C, the switch controller implements a first switch operation (see FIG. 6A), a second switch operation (see FIG. 6B) and a third switch operation (see FIG. 6C). Through the first switch operation, the oil/off switches S51 and S52 are each shifted from an open state to a closed state and maintained in a closed state for a predetermined period of time and, thereafter, are each returned to an open state. Through the second switch operation, the on/off switches S61 and S62 are each shifted from an open state to a closed state and maintained in a closed state for a predetermined period of time and, thereafter, are each returned to an open state. Through the third switch operation, the on/off switches S71 and S72 are each shifted from an open state to a closed state and, thereafter, are each returned to an open state. The second and third switch operations are alternately repeated following the first switch operation.

The first switch operation may introduce the followings: the reference capacitors Cs11 and Cs12 are electrically discharged; a voltage of the first input terminal Vin− of the comparator CMP2 is raised and a voltage of the second input terminal Vin+ of the comparator CMP2 is lowered. Such changes in voltages are illustrated in FIG. 6E. As a result, the comparator CMP2 outputs, from its output terminal, an output signal Vout at a low level, as illustrated in FIG. 6G. The second switch operation is implemented in a mariner that an electric charge stored at the voltage VE11 of the first sensor electrode E11 discharges and is charged at the first reference capacitor Cs11, whereby a level of voltage of the first imput terminal Vin− is lowered. Moreover, the second switch operation is implemented in a manner that an electric charge stored at the voltage VE12 of the second sensor electrode E12 discharges and is charged at the second reference capacitor Cs12, whereby a level of voltage of the second input terminal Vin+ is raised. The third switch operation is implemented in a manner that the first sensor electrode E11 is connected to the first power-supply voltage V1 and the second sensor electrode E12 is connected to the second power-supply voltage V2. As a result, the voltage VE11 of the first sensor electrode E11 turns to equal to the first power-supply voltage V1, and the voltage VE12 of the second sensor electrode E12 turns to equal to the second power-supply voltage V2.

Repetition of the second and third switch operations reverses a level of voltage of the First input terminal Vin− and a level of voltage of the second input terminal Vin+. Therefore, the output signal Vout of the comparator CMP2 is shifted to a high level again.

The control circuit 20 counts (counting means) a number of times of the second switch operation repeatedly implemented before the output signal Vout of the comparator CMP2 is shifted. The control circuit 10 judges (judging means) changes in the capacitances Cx11 and Cx21 based upon the number of times for repeating the second switch operation.

As described above, electric charges, of which amounts respectively correspond to the first and second capacitances Cx11, Cx21, are stored at the reference capacitors Cs11, Cs12, respectively. Two signals, which are generated based upon a difference between an electric potential at one end of the first reference capacitor Cs11 and a potential at one end of the second reference capacitor Cs12, is compared by the comparator CMP2, so that each capacitance Cx11, Cx21 is detected. For example, when the areas of the first and second sensor electrodes E11 and E12 are equal to each other in a state where V1−V3=V4−V2, increment/decrement of the voltages VE11, VE12 of the sensor electrodes E11, E12 is equal to each other. Further, it is possible to change the voltages VE11 and VE12 in opposite directions and at substantially the same timing. As a result, it is possible to restrain influences of electromagnetic disturbances and generations of radio noise.

Third Embodiment

The first and second sensor electrodes E1, E2 of the first embodiment and the first and second sensor electrodes E11, E12 of the second embodiment are not limited to the above-described structures, and the followings are applicable.

Figure 7:
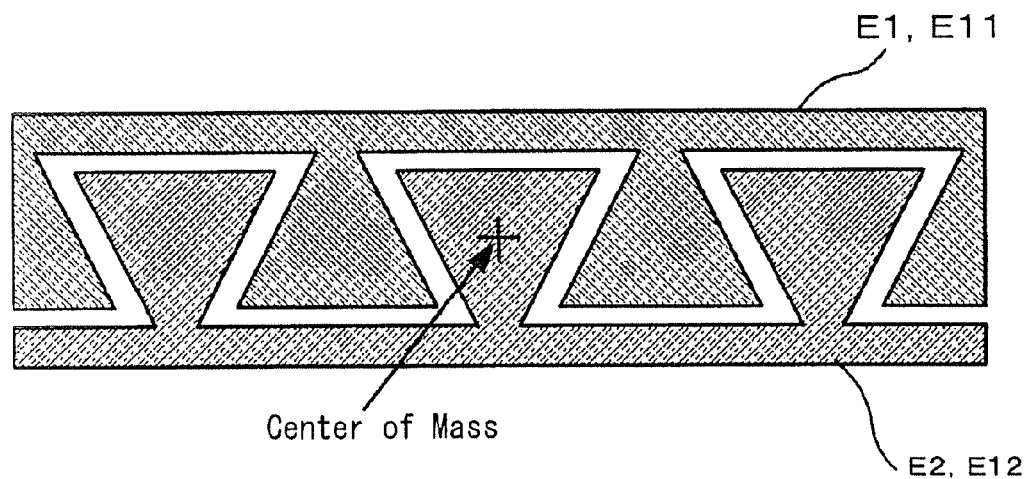
FIG. 7 is a view illustrating an example of first and second sensor electrodes.

FIG. 7 is a view illustrating an example of the sensor electrodes E1 (or E11) and E2 (or E12). The first and second sensor electrodes E1 (or E11) and E2 (or E12) are arranged to face each other. The first sensor electrode E1 (or E11) is formed with or includes first projection is extending towards the second sensor electrode E2 (or E12), and the second sensor electrode E2 (or E12) is formed with or includes second projections extending towards the first sensor electrode E1 (or E11). The first and second sensor electrodes E1 (or E11) and E2 (or E12) are arranged in a manner that each first projection does not overlap the corresponding second projection. An area of the first sensor electrode E1 (or E11) is substantially equal to the one of the second sensor electrode E2 (or E12). The center of mass of the first sensor electrode E1 (or E11) substantially matches the center of mass of the second sensor electrode E2 (or E12).

As described above, because the area of the first sensor electrode E1 (or E11) is substantially the same as the one of the second sensor electrode E2 (or E12), the sum of electric charges stored at each electrode E1 (or E11) and E2 (or E12) is equal. As described above, when each center of mass substantially matches each other, the electric charges stored are focused on the center of mass of each first and second sensor electrode E1 (or E11) and E2 (or E12). In such circumstances, changes in an electric dipole moment due to electric charges seen from an exterior ambient are reduced and a generation of radio noise is restrained. Further, an amount of electric charges induced by disturbances at the first sensor electrode E1 (or E11) is equal to an amount of electric charges induced by disturbances at the second sensor E2 (or E12), thereby reducing influences of the disturbances.

Figure 8:
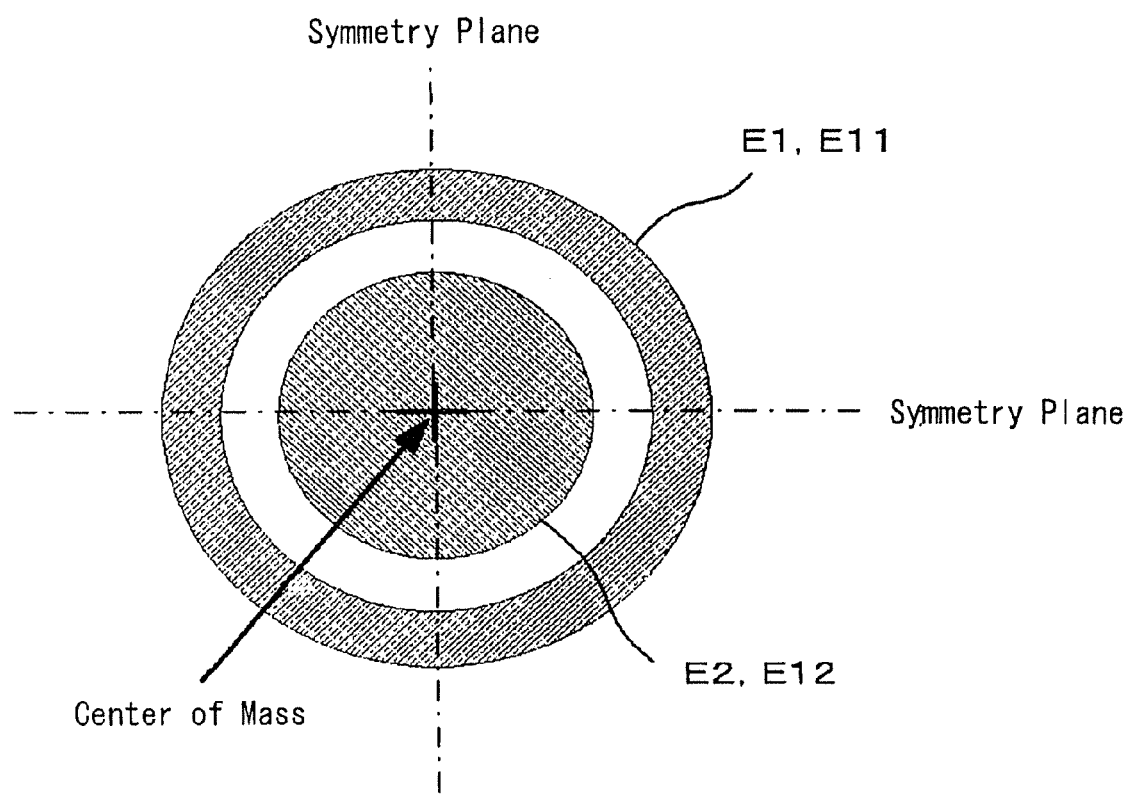
FIG. 8 is a view illustrating another example of the first and second sensor electrodes.

FIG. 8 is a view illustrating another example of the sensor electrodes E1 (or E11) and E2 (or E12). The first sensor electrode E1 (or E11) is arranged substantially in a concentric configuration with the second sensor electrode E2 (or E12). The first sensor electrode E1 (or E11) surrounds an exterior ambient of the second sensor electrode E2 (or E12). The center of mass of the first sensor electrode E1 (or E11) substantially matches the center of mass of the second sensor electrode E2 (or E12). Further, the area of the first sensor electrode E1 (or E11) is substantially the same as the one of the second sensor electrode E2 (or E12). The first sensor electrodes E1 (or E11) is symmetrical relative to at least two symmetry planes crossing the identical center of mass. Likewise, the second sensor electrode E2 (or E12) is symmetrical relative to the at least two symmetry planes crossing the identical center of mass.

As described above, when the first and second sensor electrodes E1 (or E11) and E2 (or E12) are symmetrical relative to the at least two symmetry planes crossing the identical center of mass, changes in an electric dipole moment due to electric charges seen from an exterior ambient are reduced and generations of ratio noise is restrained. Further, an amount of electric charges induced by disturbances at the first sensor electrode E1 (or E11) is equal to an amount of electric charges induced by disturbances at the second sensor E2 (or E12), thereby reducing influences of the disturbances.

Figure 9:
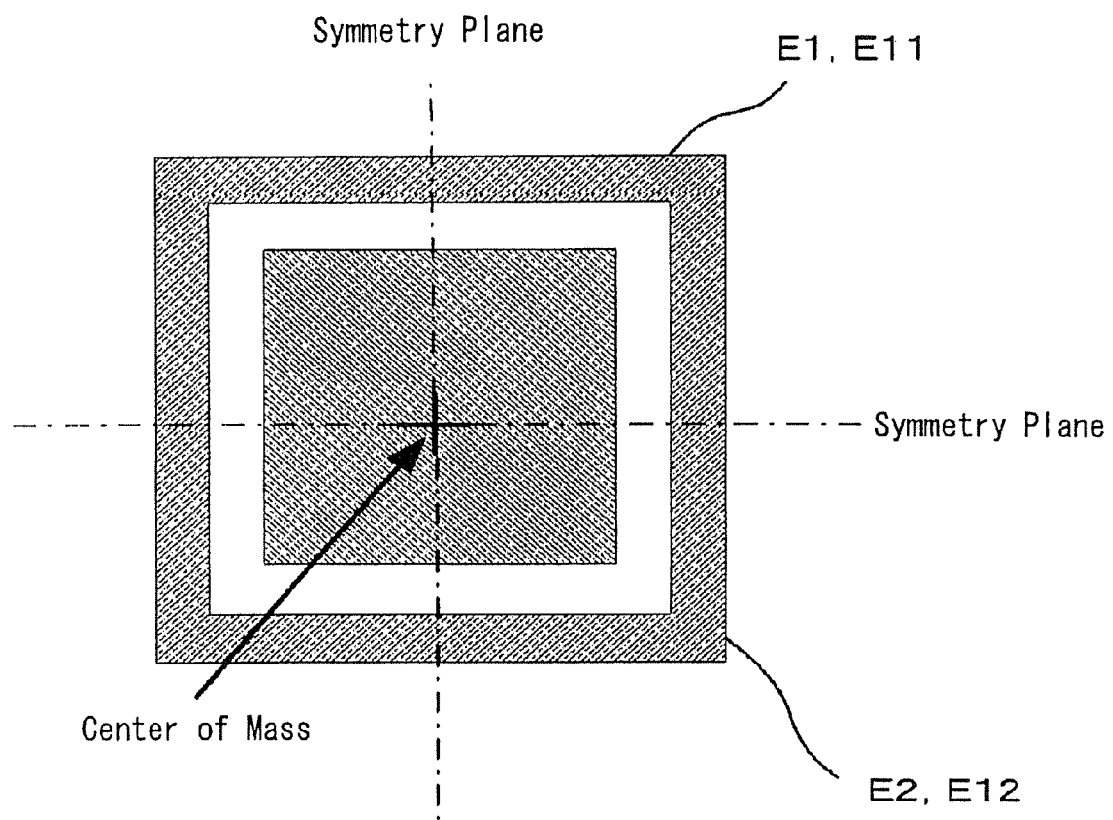
FIG. 9 is a view illustrating still another example of the first and second sensor electrodes.

FIG. 9 is a view illustrating still another example of the sensor electrodes E1 (or E11) and E2 (or E12). The second sensor electrode E2 (or E12) is of a square shape, and the first sensor electrode E1 (or E11) is arranged so as to surround the second sensor electrode E2 (or E12). The center of mass of the first sensor electrode E1 (or E11) substantially matches the center of mass of the second sensor electrode E2 (or E12). An area of the first sensor electrode E1 (or E11) is substantially equal to the one of the second sensor electrode E2 (or E12). The first sensor electrode E1 (or E11) is symmetrical relative to at least two symmetry planes crossing the identical center of mass. Likewise, the second sensor electrode E2 (E12) is symmetrical relative to the at least two symmetry planes crossing the identical center of mass.

Figure 10:
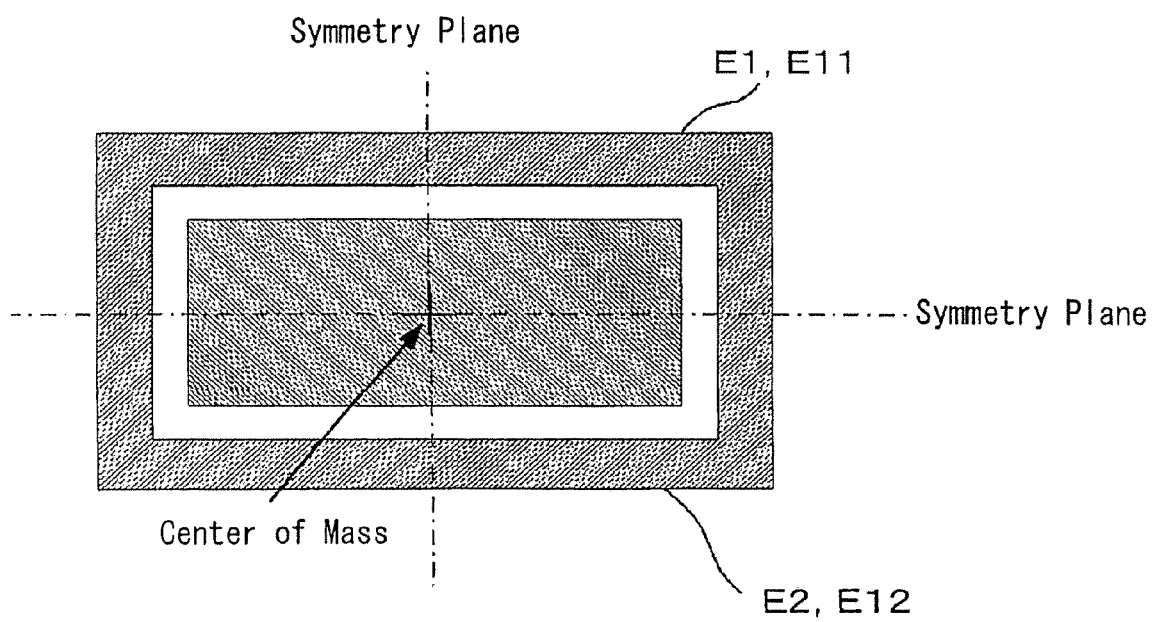
FIG. 10 is a view illustrating still another example of the first and second sensor electrodes.

FIG. 10 is a view illustrating still another example of the sensor electrodes E1 (or E11) and E2 (or E12). The second sensor electrode E2 (or E12) is of a rectangular shape, and the first sensor electrode E1 (or E11) is arranged so as to surround the second sensor electrode E2 (or E12). The center of mass of the first sensor electrode E1 (or E11) substantially matches the center of mass of the second sensor electrode E2 (or E12). An area of the first sensor electrode E1 (or E11) is substantially equal to the one of the second sensor electrode E2 (or E12). The first sensor electrode E1 (or E11) is symmetrical relative to at least two symmetry planes crossing the identical center of mass. Likewise, the second sensor electrode E2 (E12) is symmetrical relative to the at least two symmetry planes crossing the identical center of mass.

Figure 11:
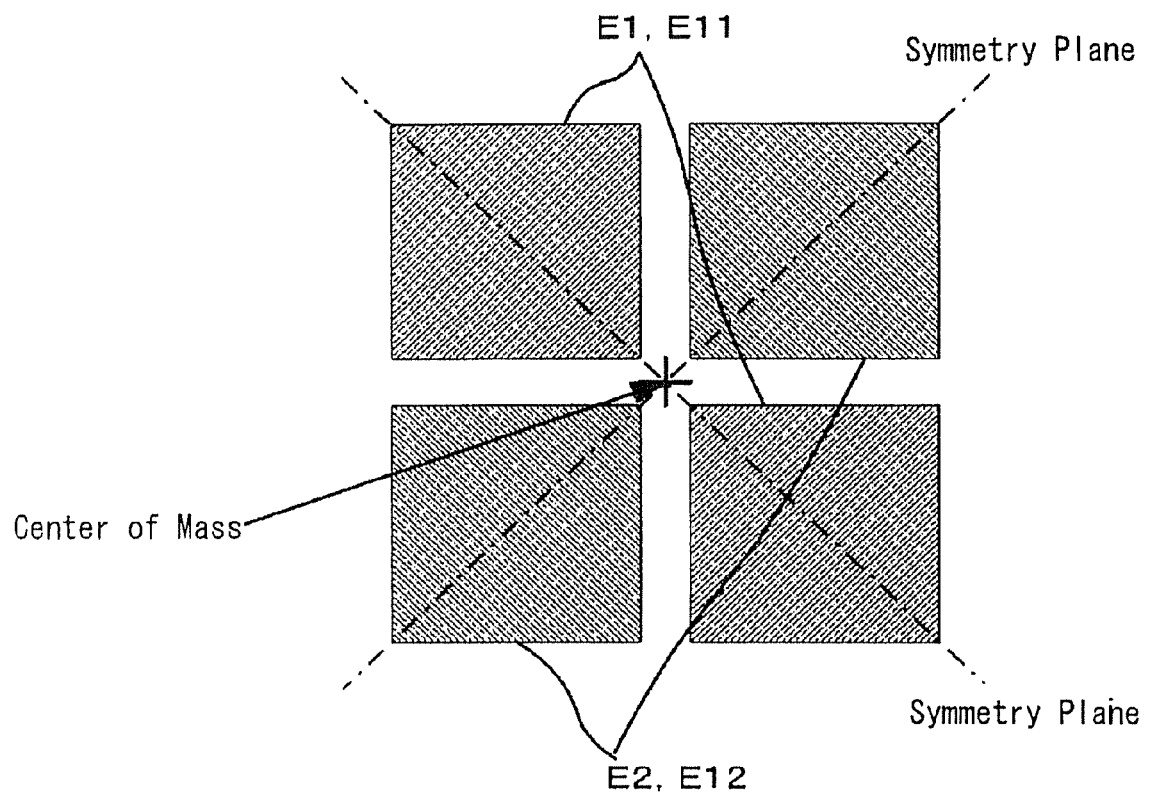
FIG. 11 is a view illustrating still another example of the first and second sensor electrodes.

FIG. 11 is a view illustrating still another example of the sensor electrodes E1 (or E11) and E2 (or E12). Each of the first and second sensor electrodes E1 (or E11) and E2 (or E12) is structured with an arbitrary quantity of electric conductor. In FIG. 11, the first sensor electrode E1 (or E11) is structured with two square-shaped electric conductors, and the second sensor electrode E2 (or E12) is also structured with two square-shaped electric conductors. The two square-shaped electric conductors of the first sensor electrode E1 (or E11) are arranged diagonally. Likewise, the two square-shaped electric conductors of the second sensor electrode E2 (or E12) are arranged diagonally.

The center of mass of the first sensor electrode E1 (or E11) substantially matches the center of mass of the second sensor electrode E2 (or E12). An area of the first sensor electrode E1 (or E11) is substantially equal to the one of the second sensor electrode E2 (or E12). The first sensor electrode E1 (or E11) is symmetrical relative to at least two symmetry planes crossing the identical center of mass. Likewise, the second sensor electrode E2 (E12) is symmetrical relative to the at least two symmetry planes crossing the identical center of mass.

Figure 12:
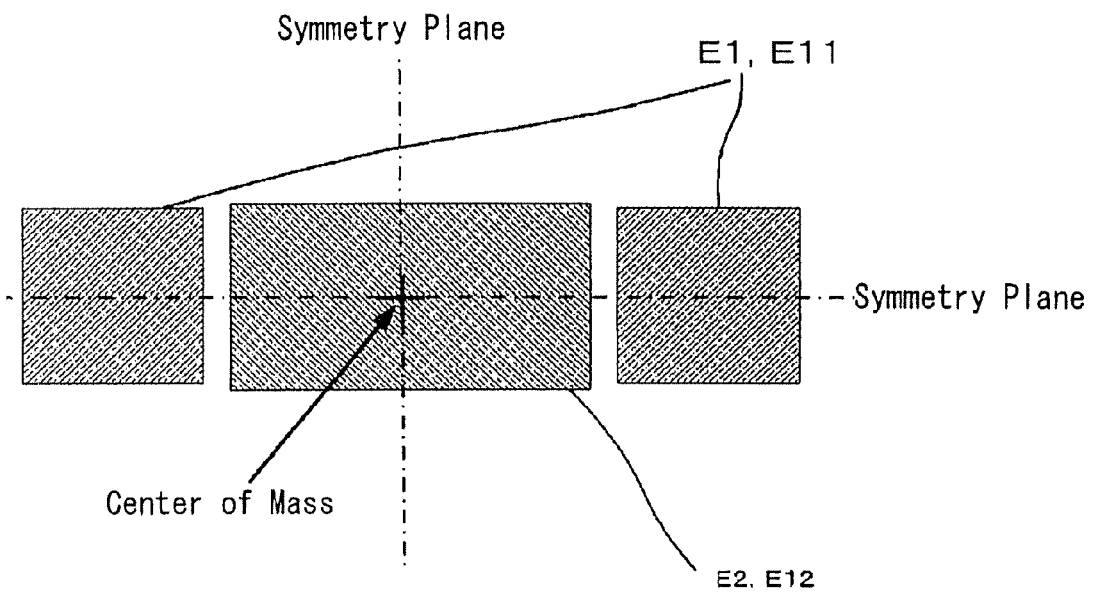
FIG. 12 is a view illustrating still another example of the first and second sensor electrodes.

FIG. 12 is a view illustrating still another example of the sensor electrodes E1 (or E11) and E2 (or E12). The first sensor electrode E1 (or E11) is structured with two square-shaped electric conductors, and the second sensor electrode E2 (or E12) is structured with a single rectangular-shaped electric conductor. The electric conductor of the second sensor electrode E2 (or E12) is interposed between the two square-shaped electric conductors of the first sensor electrode E1 (or E11). The center of mass of the first sensor electrode E1 (or E11) substantially matches the center of mass of the second sensor electrode E2 (or E12). An area of the first sensor electrode E1 (or E11) is substantially equal to the one of the second sensor electrode E2 (or E12). The first sensor electrode E1 (or E11) is symmetrical relative to at least two symmetry planes crossing the identical center of mass. Likewise, the second sensor electrode E2 (E12) is symmetrical relative to the at least two symmetry planes crossing the identical center of mass.

Figure 13:
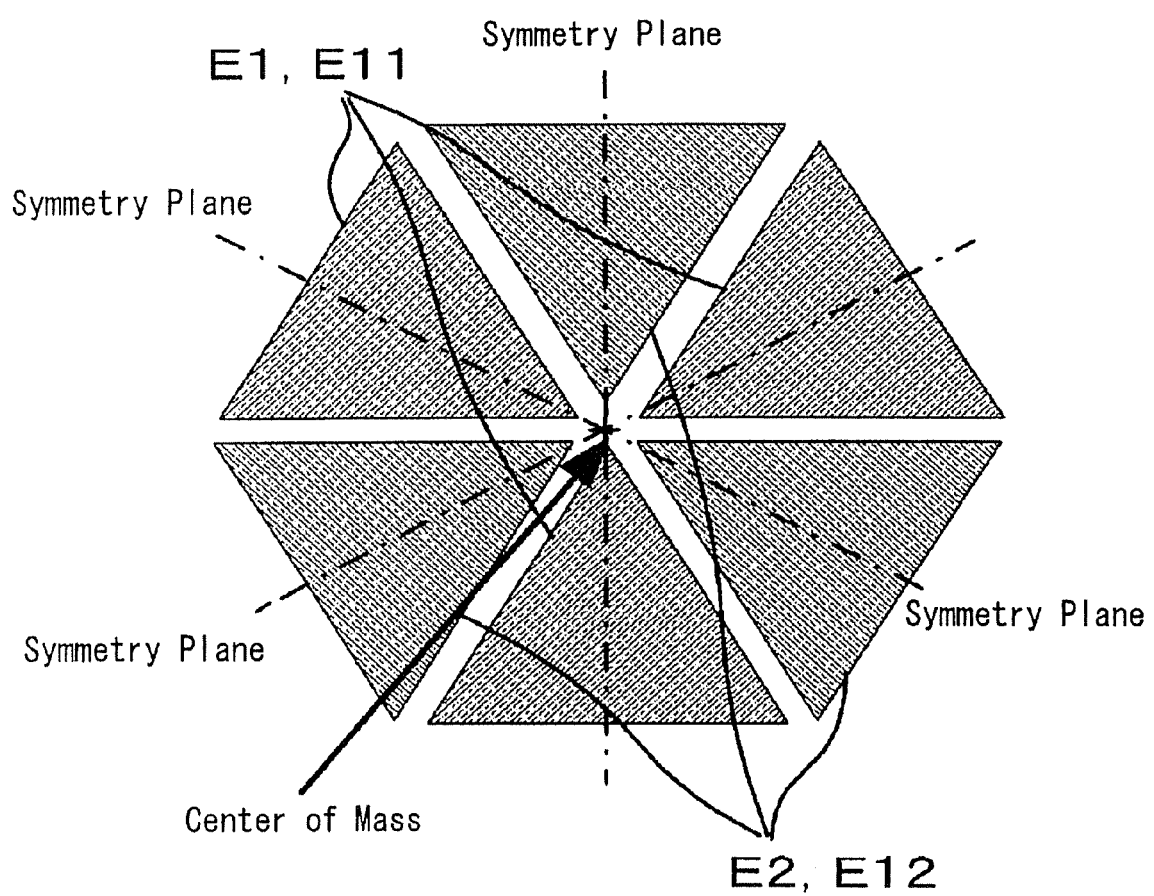
FIG. 13 is a view illustrating still another example of the first and second sensor electrodes.

FIG. 13 is a view illustrating still another example of the sensor electrodes E1 (or E11) and E2 (or E12). The first sensor electrode E1 (or E11) is structured with three pieces of first triangular-shaped conductors, and the second sensor electrode E2 (or E12) is structured with three pieces of second triangular-shaped conductors. The six triangular-shaped conductors in total are arranged alternately to exhibit a hexagon.

The center of mass of the first sensor electrode E1 (or E11) substantially matches the center of mass of the second sensor electrode E2 (or E12). An area of the first sensor electrode E1 (or E11) is substantially equal to the one of the second sensor electrode E2 (or E12). The first sensor electrode E1 (or E11) is symmetrical relative to at least two symmetry planes crossing the identical center of mass. Likewise, the second sensor electrode E2 (E12) is symmetrical relative to the at least two symmetry planes crossing the identical center of mass. The shape of the electrode is not limited to the above embodiments and can be modified in various ways.

Fourth Embodiment

FIG. 14 is a view illustrating a capacitance detecting apparatus 20 according to a Fourth embodiment of the present invention. The capacitance detecting apparatus 20 includes: a sensor electrode E1; a reference capacitor 21; a first on/off switch S22; a second on/off switch S23; a third on/off switch S24; a lowpass filter (hereinafter referred to as LPF) 25; a diode 26 as a second rectifying element; a diode 27 as a first rectifying element; a comparator 28 and a controller 29.

As illustrated in FIG. 14, a reference sign Cx hereinbelow depicts a variable capacitance or a variable capacitor. The variable capacitor Cx includes the sensor electrode E1 and a head of an occupant of a vehicle facing the sensor electrode E1. Hence, the sensor electrode E1 serves as an electrode at one end of the variable capacitor Cx, and the head of the occupant operates both as a grounded medium (measured object) and as a ground electrode of the variable capacitor Cx. The variable capacitance Cx varies in response to a distance between the sensor electrode E1 and the head of the occupant.

The first sensor electrode E1 is connected to the LPF 25. The first sensor electrode E1 is connected to the LPF 25. The LPF 25 may be a ferrite bead acting as high impedance to high frequency.

The reference capacitor 21 is connected to the first power-supply voltage V1 at one electrode and connected to the first electrical node N1 at the other electrode. The on/off switch S22 is connected to the first power-supply voltage V1 at one end and to the first electrical node N1 at the other end. The first electrical node N1 is further connected to one end of the on/off switch S23 and to an inverting input terminal (−) (first input terminal) of the comparator 28.

The on/off switch S23 is connected, at the other end, to the second electrical node N2 which is connected to an output terminal of the LPF 25. The second electrical node N2 is further connected to one end of the on/off switch S24. The on/off switch S24 is connected, at the other end, to the second power-supply voltage V2. The second power-supply voltage V2 may be, for example, a ground electric potential. The diode 26 is connected to the second power-supply voltage V2 at its anode and to the output terminal of the LPF 25 at its cathode. The diode 26 prevents a voltage of the output terminal of the LPF 25 from being lower than the second power-supply voltage V2.

The diode 27 is connected to the output terminal of the LPF 25 at its anode and to the first power-supply voltage V1 at its cathode. The diode 27 prevents a voltage of the output terminal of the LPF 25 from being higher than the one of the first power-supply voltage V1.

A non-inverting input terminal (+) (second input terminal) of the comparator 28 is inputted with a reference voltage V4 as an input voltage Vin+. The output terminal of the comparator 28 is connected to the controller 29. A relationship between the first power-supply voltage V1, the second power-supply voltage V2 and the reference voltage V4 is expressed as V1>V4>V2.

The controller 29 serves as switch controlling means for controlling a switch operation of each on/off switch S22, S23 and S24, counting means for counting a number of "on" and "off" of the on-off switch S23, and detecting means for judging a presence, or an absence, of a reverse of a level of an output voltage of the comparator 28 and for detecting a presence, or an absence, of a proximity of a head of an occupant towards the sensor electrode E1 based upon the judgment result and a value counted by the counting means. The controller 20 is configured with a CPU.

Described below is a fundamental operation of the capacitance detecting apparatus 20. FIGS. 15A to 15G are each a timing chart for explaining an operation of the capacitance detecting apparatus 20.

Figure 15:
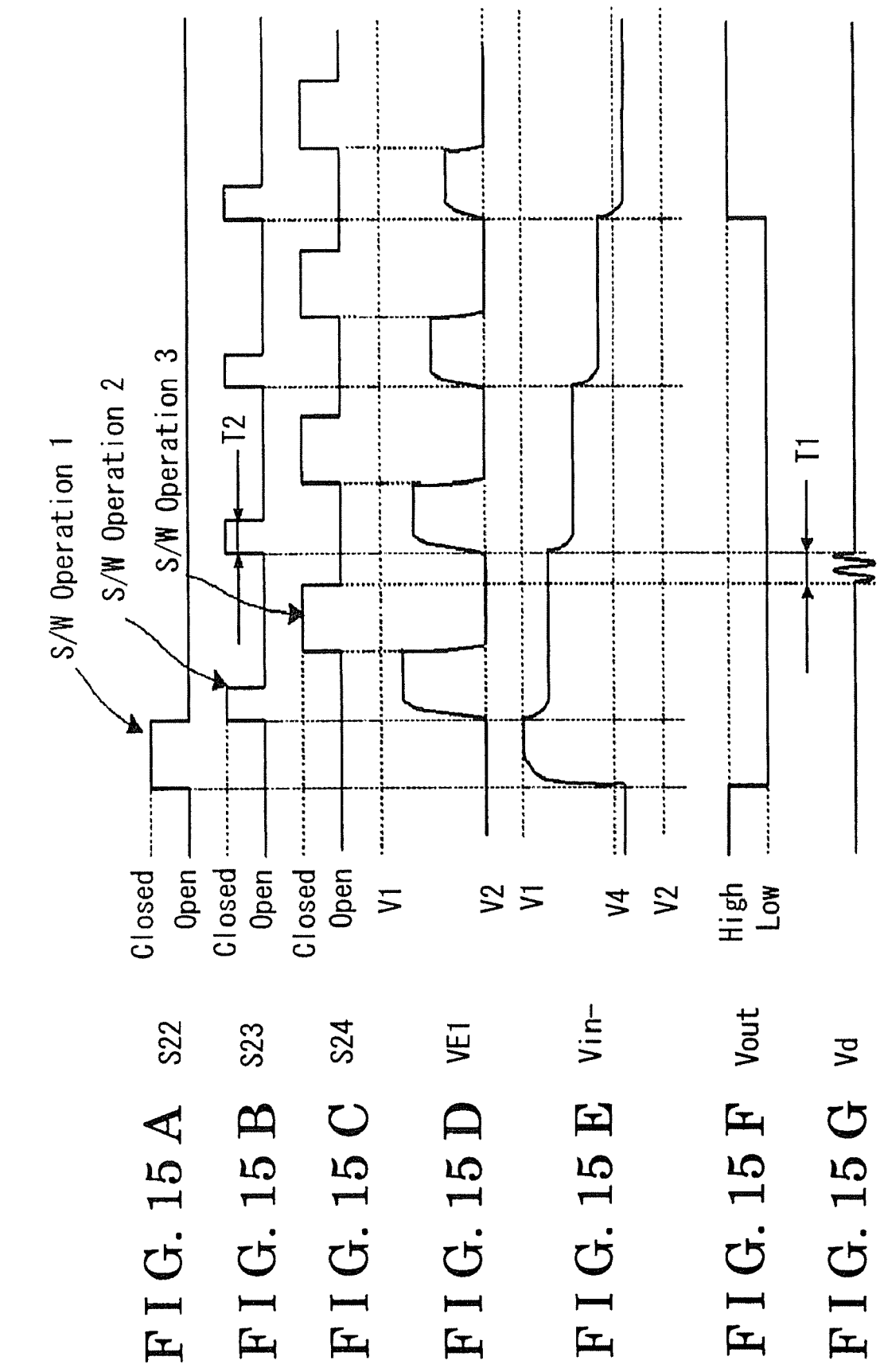
FIGS. 15A to 15G are timing charts for explaining an operation of the capacitance detecting apparatus.

As illustrated in FIGS. 15A, 15B and 15C, the controller 29 controls a first switch operation (s/w operation 1, see FIG. 15A), a second switch operation (s/w operation 2, see FIG. 15B) and a third switch operation (s/w operation 3, see FIG. 15). Through the first switch operation, the on/off switch S22 is shifted from an open state to a closed state and maintained in the closed state for a predetermined period of time and, thereafter, is returned to an open state. Through the second switch operation, the on/off switch S23 is shifted from an open state to a closed state and maintained in the closed state for a predetermined period of time and, thereafter, are each returned to an open state. Through the third switch operation, the on/off switches S24 is shifted from an open state to a closed state and maintained in the closed state for a predetermined period of time and, thereafter, are each returned to an open state. The second and third switch operations are alternately repeated following the first switch operation.

Though the first switch operation, the one end of the reference capacitor 21 is short-circuited to the other end thereof. As a result, an input voltage Vin− of the inverting input terminal (−) of the comparator 28 is raised to the first power-supply voltage V1 (see FIG. 15E), and an output signal Vout of the comparator 28 is shifted to a low level (see FIG. 15F).

Through the second switch operation, the reference capacitor 21, the LPF 25 and the variable capacitor Cx are connected in series between the first power-supply voltage V1 and the ground electric potential, and the reference capacitor 21 and the variable capacitor Cx are electrically charged. As a result, the voltage VE1 of the first sensor electrode E1 is raised (see FIG. 15D), and the input voltage Vin− of the inverting input terminal (−) of the comparator 28 is lowered (see FIG. 15E).

Through the third switch operation, because the first sensor electrode E1 is connected to the second power-supply voltage V2, the variable capacitor Cx is electrically discharged and the voltage VE1 of the first sensor electrode E1 becomes equal to the second power-supply voltage V2.

Through the repetition of the second and third switch operations, the variable capacitor Cx electrically discharged is connected to the reference capacitor 21, so that the reference capacitor 21 is electrically discharged. As a result, the voltage Vin− of the inverting input terminal (−) of the comparator 28 is lowered stepwisely. When the voltage Vin− of the inverting input terminal (−) of the comparator 28 becomes lower than the reference voltage V4, the output signal Vout of the comparator 28 is reversed from a low level to a high level.

After the output signal Vout of the comparator 28 is reversed from the low level to the high level, the controller 29 repeats a series of the first, second and third switch operations.

A capacity of the variable capacitor Cx is determined by a distance between a head of an occupant and the sensor electrode E1. When the distance between the head of the occupant and the sensor electrode E1 is large, the capacity of the variable capacitor Cx is small. When the distance therebetween is small, the capacity of the variable capacitance Cx is large.

The larger the capacity of the variable capacitor Cx is (i.e., the smaller the distance between the head of the occupant and the first sensor electrode E1 is), decrement of the voltage Vin− of the inverting input terminal (−) of the comparator 28 at every repetition of the second and third switch operations is large. Therefore, when the distance between the head of the occupant and the first sensor electrode E1 is small, the number of times for repeating the second switch operation before the output signal Vout of the comparator 28 is reversed from a low level to a high level is small.

The controller 29 counts the number of times for repeating the second switch operation following the first switch operation before the output signal Vout of the comparator 28 is reversed from a low level to a high level. The number of times is employed to detect changes in the capacity of the variable capacitor Cx. When the number of times is smaller than, or equal to, a predetermined value, the controller 29 judges that the sensor electrode E1 is sufficiently close to a head of an occupant.

The voltage VE1 at the first sensor electrode E1 occasionally fluctuates due to disturbances Vd (FIG. 15G). Especially, when the voltage VE1 at the sensor electrode E1 is lower than the second power-supply voltage V2 due to the disturbances Vd somewhere within a period of time T1 defined by a moment, where the on/off switch S24 is switched to an open state after the third switch operation, and a moment, where the on/off switch S23 is switched to a closed state by the second switch operation, electrical charge shifts from the second power-supply voltage V2 to the first sensor electrode E1. As a result, the variable capacitor Cx is electrically charged and changes in the capacity of the variable capacitor Cx may be detected erroneously. In light of the foregoing, a cutoff frequency fc1 of the LPF 25 is determined so as to satisfy the following equation (1).

$$1/T2 < fc1 < 1/(2 \times T1) \cdots \quad (1)$$

here T2 is a period of time for the on/off switch S23 to change from a closed state to an open state.

In a case where the cutoff frequency fc1 of the LPF 25 satisfies the equation (1), even when the voltage VE1 of the sensor electrode E1 fluctuates due to the disturbances Vd, the disturbances Vd are cut off by the LPF 25, thereby restraining a shift of the electric charge from the side of the second power-supply voltage V2 to the sensor electrode E1 via the diode 26. Therefore, it is possible to detect the changes in the capacity of the variable capacitor Cx with high precision. Further, when a difference between the period of time T1 and the period of time T2 is less, the disturbances Vd may not be cut off sufficiently. Therefore, it is preferable that the period of time T1 is set to be sufficiently shorter than the period of time T2.

Fifth Embodiment

Figure 16:
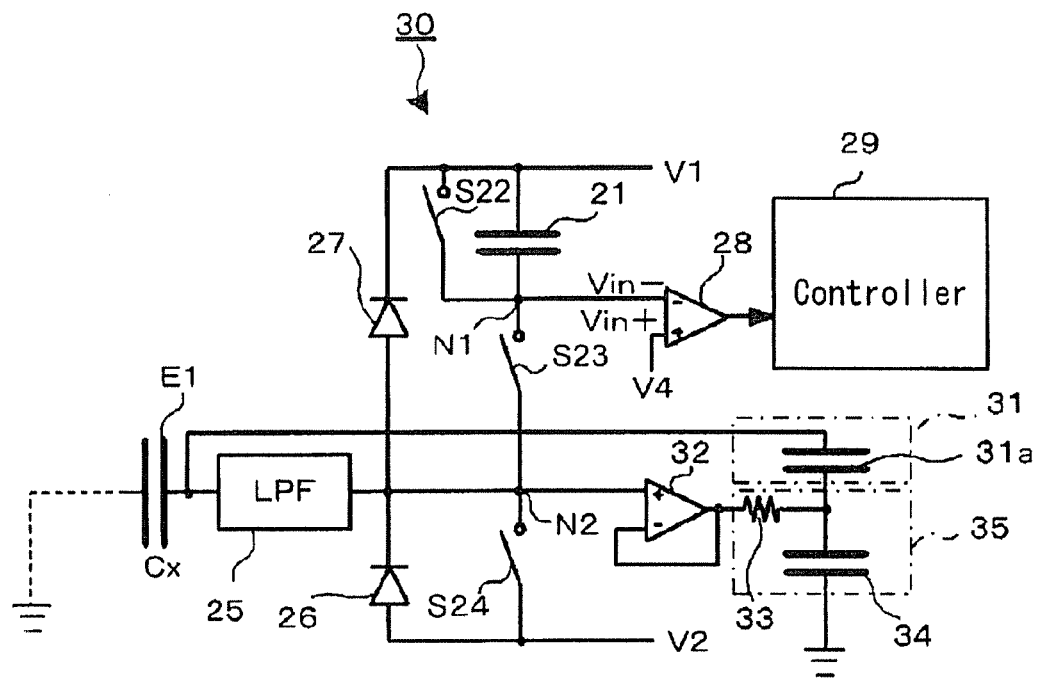
FIG. 16 is a circuit view illustrating a capacitance detecting apparatus according to a fifth embodiment of the present invention.

FIG. 16 is a view illustrating a capacitance detecting apparatus 30 according to a fifth embodiment of the present invention. Identical elements in FIG. 14 are attached with identical references, respectively. The capacitance detecting apparatus 30 is incorporated in a seat for a vehicle. Likewise as the capacitance detecting apparatus 20 of the fourth embodiment, the capacitance detecting apparatus 30 includes: the sensor electrode E1; the reference capacitor 21; the on/off switches S22, S23, S24; the LPF 25; the diodes 26, 27; the comparator 28; and the controller 29, and all of these components are connected in the same manner as illustrated in FIG. 14.

The capacitance detecting apparatus 30 further includes a capacitor 31a configuring a high-pass filter (hereinafter referred to as HPF), a buffer 32, a resistor 33 and a capacitor 34.

The capacitor 31a is connected to the sensor electrode E1 at one electrode. The buffer 32, which is structured with an operational amplifier, is connected, at its non-inverting input terminal (+), to the output terminal of the LPF 25. An inverting input terminal of the buffer 32 is connected to an output terminal of the buffer 32. The output terminal of the buffer 32 is connected to one electrode of the capacitor 34 via the resistor 33. The other electrode of the capacitor 34 is grounded. The resistor 33 and the capacitor 34 structure an LPF 35, and a connecting point of the resistor 33 and the capacitor 34 serves as an output terminal of the LPF 35. The output terminal of the LPF 35 is connected to the other electrode of the capacitor 31a.

In the same manner as the capacitance detecting apparatus 20 of the fourth embodiment, the controller 29 of the capacitance detecting apparatus 30 alternately repeats a second switch operation, by which the on/off switch S23 is shifted from an open state to a closed state and maintained in the closed state for a predetermined period of time and, thereafter, is returned to the open state, and a third switch operation, by which the on/off switch S24 is shifted from an open state to a closed state and maintained in the closed state for a predetermined period of time and, thereafter, is returned to the open state, following a first switch operation, by which the on/off switch S22 is shifted from an open state to a closed state and maintained in the closed state for a predetermined period of time and, thereafter, is returned to the open state.

A cutoff frequency fc1 of the LPF 25 is set to satisfy the equation (1) described above. A cutoff frequency fc2 of the LPF 35 is set to satisfy the following equation (2).

$$1/T2 < fc2 < 1/(2 \times T1) \cdots \quad (2)$$

Through the first switch operation, the one electrode of the reference capacitor 21 is short-circuited to the other electrode thereof. Through the second switch operation, the reference capacitor 21, the LPF 25 and the variable capacitor Cx are connected in series between the first power-supply voltage V1 and the ground electric potential. Through the third switch operation, the sensor electrode E1 is connected to the second power-supply voltage V2, and the variable capacitor Cx is electrically discharged. As a result, the voltage of the first sensor electrode E1 becomes equal to the voltage of the second power-supply voltage V2. Through the repetition of the second and third switch operations, the variable capacitor Cx electrically discharged is connected to the reference capacitor 21, so that the reference capacitor 21 is electrically discharged. As a result, the voltage Vin− of the interting input terminal (−) of the comparator 28 is lowered stepwisely. When the voltage Vin− of the inverting input terminal (−) of the comparator 28 becomes lower than the reference voltage V4, the output signal Vout of the comparator 28 is reversed from a low level to a high level.

After the output signal Vout of the comparator 28 is reversed from the low level to the high level, the controller 29 repeats a series of the first, second and third switch operations.

The controller 29 counts the number of times for repeating the second switch operation. The number of times is employed to detect changes in the capacity of the variable capacitor Cx. When the number of times is smaller than, or equal to, a predetermined value, the controller 29 judges that the sensor electrode E1 is sufficiently close to a head of an occupant.

Likewise as the capacitance detecting apparatus 20 of the fourth embodiment, in the capacitance detecting apparatus 30 according to the fifth embodiment, the cutoff frequency fc1 of the LPF 25 is set to satisfy the equation (1). Therefore, even when the voltage VE1 of the sensor electrode E1 fluctuates due to the disturbances Vd, the disturbances Vd are cut off by the LPF 25, thereby restraining a shift of the electric charge from the side of the second power-supply voltage V2 to the sensor electrode E via the diode 26. Therefore, it is possible to prevent changes in the capacitance from being detected erroneously.

Further, the capacitance detecting apparatus 30 includes the capacitor 31a as the HPF 31. The capacitor 31a sends to ground a high-frequency component of the disturbances Vd superimposed over the voltage of the sensor electrode E1. Therefore, it is possible to reduce influences of the disturbances Vd more than the capacitance detecting apparatus 20 does. Further, the output terminal of the LPF 25 and the other electrode of the capacitor 31a, which is the output terminal of the HPF 31, are connected via the buffer 32. Therefore, the voltage at the other electrode of the capacitor 31a is set at the voltage VE1 of the sensor electrode E1, the voltage VE1 which is not superimposed with the disturbances Vd. As a result, the capacitor 31a is prevented from serving as a parasitic capacitor of the sensor electrode E1, thereby restraining influence on measuring changes in the capacitance.

Still further, the other electrode of the capacitor 31a is connected to a connecting point of the resistor 33 and the capacitor 34. Therefore, it is possible to prevent the disturbances Vd from returning to the output terminal of the LPF 25 via the buffer 32.

The capacitance detecting apparatus 30 according to the fifth embodiment is not limited to the above and can be modified in various ways. The following LPF is applicable for example.

Figure 17:
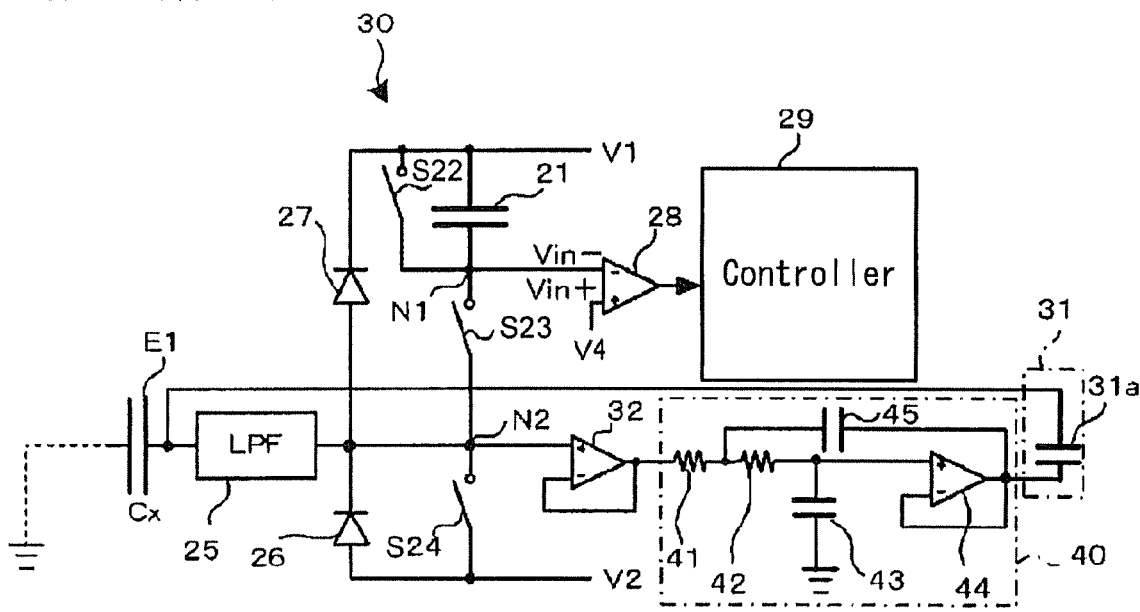
FIG. 17 is a circuit view illustrating a modification of the capacitance detecting apparatus in FIG. 16
Figure 18:
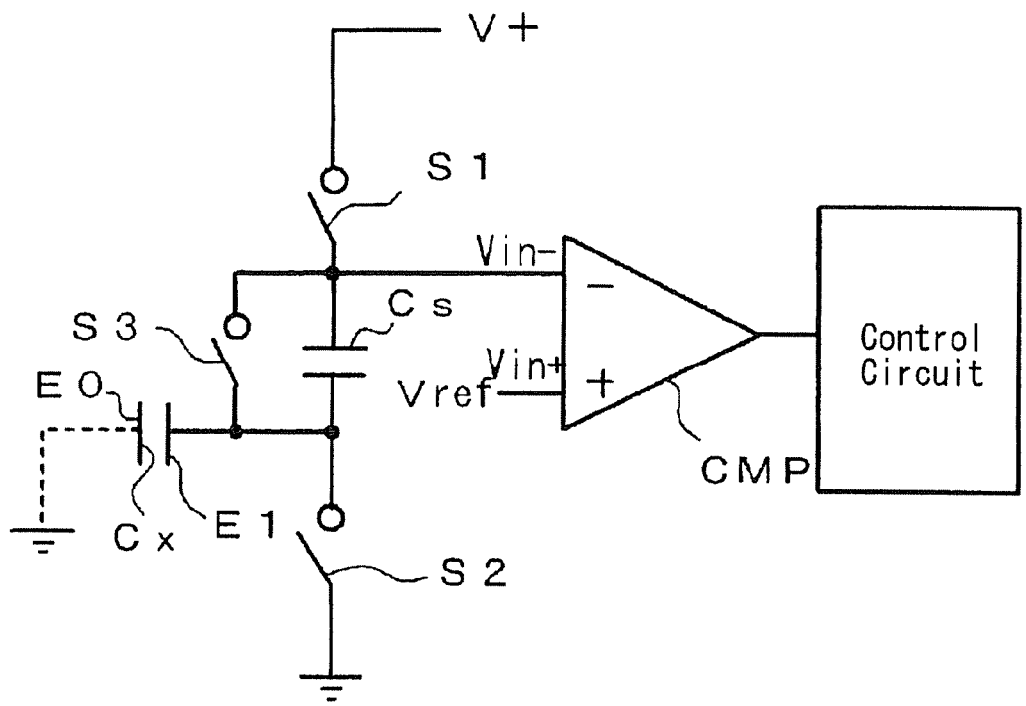
FIG. 18 is a circuit view illustrating a conventional capacitance detecting apparatus.
Figure 19:
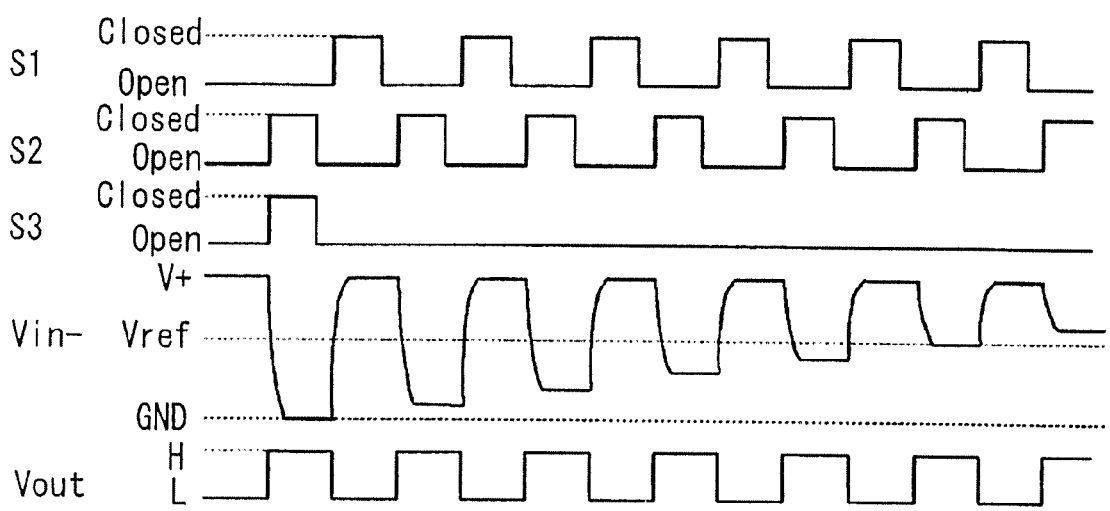
FIG. 19 is a time chart for explaining an operation the capacitance detecting apparatus in FIG. 18.

Sixth Embodiment (1) FIG. 17 is a circuit view illustrating a modification of the capacitance detecting apparatus in FIG. 16. Identical elements in FIG. 16 are attached with identical references, respectively. The capacitance detecting apparatus 30 in FIG. 16 employs the LPF 35 having the resistor 33 and the capacitor 34. Alternatively, the LPF 35 can be modified to an LPF 40 in FIG. 17. The LPF 40 in FIG. 17 includes: a resistor 41 connected to the output terminal of the buffer 32 at one end; a resistor 42 connected, at its one end, to the other end of the resistor 41; a capacitor 43 connected to the other end of the resistor 42 at one end and to a ground at the other end; a buffer 44 connected to the other end of the resistor 42 at a non-inverting input terminal (+); and a capacitor 45. One electrode of the capacitor 45 is connected to a connecting point of the resistor 41 and the resistor 42. The other electrode of the capacitor 45 is connected to an output terminal of the buffer 44. An inverting input terminal (−) of the buffer 44 is connected to the output terminal of the buffer 44. The output terminal of the buffer 44 serves as an output terminal of the LPF 40 and is connected to the other electrode of the capacitor 31*a*. In the LPF 40, a high-frequency component, which passes the buffer 32, is removed by the resistors 41, 42 and the capacitor 43. A high-frequency component from the capacitor 31*a* is sent to ground via the capacitor 45, the resistor 42 and the capacitor 43. The resistor 41 prevents the high-frequency component from the capacitor 31*a* from returning to the side of the output terminal of the LPF 25 via the buffer 32. Changing from the LPF 30 to the LPF 40 enhances detection precision of the capacitance detecting apparatus 30.

(2) Each of the capacitance detecting apparatuses in FIGS. 16 and 17 employs the LPF 25. However, in a case where a high-frequency component is removed sufficiently at the capacitor 31*a* as the HPF, there is no need to have the LPF 25.

According to an aspect, when a first ratio between the area of the first sensor electrode E1 and the capacitance of the first reference capacitor Cs1 is equal to the second ratio between the area of the second sensor electrode E2 and the capacitance of the second reference capacitor Cs1, it is possible to restrain a possible influence of electromagnetic disturbances onto an input signal of the comparator CMP1. From this point of view, the capacitance detecting apparatus described above is further effective. The first and second ratios are considered to be equal when two significant figures of the first ratio are identical to two significant figures of the second ratio. Further, when the area of the first sensor electrode E1 is equal to the area of the second sensor electrode E2, it is possible to restrain influence of radio noise against the input signal of the comparator CMP1. From this point of view, the capacitance detecting apparatus described above is further effective. The areas of the first and second sensor electrodes E1 and E2 are considered to be equal when two significant figures of the area of the first sensor electrode E1 are identical to two significant figures of the area of the second sensor electrode E2.

According still another aspect, a capacitance detecting apparatus includes: a first capacitor Cx11 having a first sensor electrode E11 at one end, the first sensor electrode E11 being adapted to face a measured object E0 and storing an electric charge at an amount corresponding to an electric potential of the first sensor electrode E11, the first capacitor Cx11 being configured to output a first capacitance Cx11 which varies in response to a distance between the first sensor electrode E11 and the measured object E0; a second capacitor Cx21 having a second sensor electrode E12 at one end, the second sensor electrode E12 being adapted to face the measured object E0 and storing an electric charge at an amount corresponding to an electric potential of the second sensor electrode E12, the second capacitor Cx21 being configured to output a second capacitance Cx21 which varies in response to a distance between the second sensor electrode E12 and the measured object E0; a first reference capacitor Cs11 configured to be connected to the first capacitor Cx11; and a second reference capacitor Cs12 configured to be connected to the second capacitor Cx21. The electric charge stored at the first sensor electrode E11 is discharged and stored at the first reference capacitor Cs11, the electric charge stored at the second sensor electrode E12 is discharged and stored at the second reference capacitor Cs12, so that the first capacitance Cx11 of the first capacitor Cx11 and the second capacitance Cx21 of the second capacitor Cx21 are detected based upon a difference between an electric potential at one end of the first reference capacitor Cs11 and an electric potential at one end of the second reference capacitor Cs12. The electric potential of the first sensor electrode E1 and the electric potential of the second sensor electrode E12 change at an identical increment/decrement and in opposite directions.

It is preferable that an area of the first sensor electrode E11 is equal to an area of the second sensor electrode E12. In this case, influence of electromagnetic disturbances against an input signal of a comparator CMP2 is reduced, which is further effective.

It is preferable that the first sensor electrode E11 is structured with an arbitrary quantity of electric conductor, the second sensor electrode E12 is structured with an arbitrary quantity of electric conductor, and the center of mass of the first sensor electrode E11 matches the center of mass of the second sensor electrode E12. In this case, it is possible to restrain an generation of radio noise at the first and second sensor electrodes, and to reduce an amount of electric charge induced by a disturbance signal. The center of mass of the first sensor electrode E11 and the center of mass of the second sensor electrode E12 are considered to be matched each other when two significant figures of the center of mass of the first sensor electrode E11 are identical to two significant figures of the center of mass of the second sensor electrode E12.

According to still another aspect, a capacitance detecting apparatus includes: a capacitor Cx having a sensor electrode E1 at one end, the sensor electrode E1 being adapted to face a measured object, the capacitor Cx being configured to output capacitance Cx in response to a distance between the sensor electrode E1 and the measured object; a reference capacitor 21 connected to a first power-supply voltage V1 at one electrode and a first electrical node N1 at the other electrode; a first on/off switch S22 connected to the first power-supply voltage V1 at one end and to the first electrical node N1 at the other end; a lowpass filter 25 connected to the sensor electrode E1 at an input terminal and to a second electrical node N2 at an output terminal; a second on/off switch S23 connected to the first electrical node N1 at one end and to the second electrical node N2 at the other end; a third on/off switch S24 connected to the second electrical node N2 at one end and to the a second power-supply voltage V2 lower than the first power-supply voltage V1 at the other end; a first rectifying element 27 connected between the second electrical node N2 and the first power-supply voltage V1 and adapted to be electrically conducted when an electric potential of the second electrical node N2 is higher than the first power-supply voltage V1; a second rectifying element 26 connected between the second electrical node N2 and the second power-supply voltage V2 and adapted to be electrically conducted when the electric potential of the second electrical node N2 is lower than the second power-supply voltage V2; a comparator CMP connected to the first electrical node N1 at a first input terminal Vin− and to a reference power-supply voltage V4 at a second input terminal Vin+; and a controller 29 controlling the first second and third on/off switches S22, S23, S24, implementing a process for alternately repeating a second switch operation, by which the second on/off switch S23 is changed to a closed state and returned to an open state, and a third switch operation, by which the third switch S24 is changed to a closed state and returned to an open state, following a first switch operation, by which the first switch S22 is changed to a closed state and returned to an open state, and implementing a process for counting a number of times for repeating the second switch operation and for judging changes in the capacitance at the capacitor Cx based upon the number of times for repeating the second switch operation before a level of voltage at the first input terminal and a level of voltage at the second imputer terminal are reversed.

A cutoff frequency fc1 of the lowpass filter 25 may be set to satisfy $1/T2 < fc1 < \frac{1}{2} \times T1$ when T1 depicts a period of time defined by a time, where the third on/off switch S24 is switched to an open state, and a time, where the second on/off switch S23 is switched to a closed state, and T2 depicts a period of time for the second on/off switch S23 to return to an open state from the closed state.

The capacitance detecting apparatus may further includes: a high-pass filter 31*a* connected to the sensor electrode at one end and passing a high-frequency component on the sensor electrode; and a buffer 32 connected to the second electrical node N2 at an input terminal and to the other end of the high-pass filter 31*a* at an output terminal.

The principles, of the preferred embodiment and mode of operation of the present invention have been described in the foregoing specification. However, the invention, which is intended to be protected, is not to be construed as limited to the particular embodiment disclosed. Further, the embodiment described herein are to be regarded as illustrative rather than restrictive. Fluctuations and changes may be made by others, and equivalents employed, without departing from the spirit of the present invention. Accordingly, it is expressly intended that all such fluctuations, changes and equivalents that fall within the spirit and scope of the present invention as defined in the claims, be embraced thereby.

The invention claimed is:

1. A capacitance detecting apparatus comprising:
   a first variable capacitor having a first sensor electrode at one end, the first sensor electrode being adapted to face a measured object and storing an electric charge at an amount corresponding to an electric potential of the first sensor electrode, the first capacitor being configured to output a first capacitance which varies in response to a distance between the first sensor electrode and the measured object;
   a second variable capacitor having a second sensor electrode at one end, the second sensor electrode being adapted to face the measured object and storing an electric charge at an amount corresponding to an electric potential of the second sensor electrode, the second capacitor being configured to output a second capacitance which varies in response to a distance between the second sensor electrode and the measured object;
   a first reference capacitor configured to be connected to the first variable capacitor; and
   a second reference capacitor configured to be connected to the second variable capacitor;
   wherein the electric charge stored at the first sensor electrode is discharged and stored at the first reference capacitor, the electric charge stored at the second sensor electrode is discharged and stored at the second reference capacitor, so that the first capacitance of the first variable capacitor and the second capacitance of the second variable capacitor are detected based upon a difference between an electric potential at one end of the first reference capacitor and an electric potential at one end of the second reference capacitor, and
   wherein the electric potential of the first sensor electrode and the electric potential of the second sensor electrode change at an identical increment/decrement and in opposite directions.

2. A capacitance detecting apparatus according to claim 1, wherein an area of the first sensor electrode is equal to an area of the second sensor electrode.

3. A capacitance detecting apparatus according to claim 2, wherein the first sensor electrode is structured with an arbitrary quantity of electric conductor, the second sensor electrode is structured with an arbitrary quantity of electric conductor, and the center of mass of the first sensor electrode matches the center of mass of the second sensor electrode.

4. A capacitance detecting apparatus according to claim 3, wherein the first sensor electrode is symmetrical relative to at least two symmetry planes crossing the matched centers of mass, and the second sensor electrode is symmetrical relative to the at least two symmetry planes crossing the matched centers of mass.

\* \* \* \* \*